US011171239B2

(12) United States Patent
Naylor et al.

(10) Patent No.: US 11,171,239 B2
(45) Date of Patent: Nov. 9, 2021

(54) TRANSISTOR CHANNEL PASSIVATION WITH 2D CRYSTALLINE MATERIAL

(71) Applicant: Intel Corporation, Santa Clara, CA (US)

(72) Inventors: Carl Naylor, Portland, OR (US); Abhishek Sharma, Hillsboro, OR (US); Mauro Kobrinsky, Portland, OR (US); Christopher Jezewski, Portland, OR (US); Urusa Alaan, Hillsboro, OR (US); Justin Weber, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/570,965

(22) Filed: Sep. 13, 2019

(65) Prior Publication Data

US 2021/0083122 A1    Mar. 18, 2021

(51) Int. Cl.
*H01L 29/786* (2006.01)
*H01L 29/66* (2006.01)
*H01L 27/12* (2006.01)

(52) U.S. Cl.
CPC .... *H01L 29/78609* (2013.01); *H01L 27/1207* (2013.01); *H01L 29/66969* (2013.01); *H01L 29/7869* (2013.01)

(58) Field of Classification Search
CPC ................. H01L 29/78609; H01L 29/7869
See application file for complete search history.

(56) References Cited

U.S. PATENT DOCUMENTS

| 5,663,584 A * | 9/1997 | Welch ................. H01L 29/7839 257/288 |
| 2016/0372615 A1* | 12/2016 | Yang ..................... H01L 31/032 |
| 2017/0261465 A1* | 9/2017 | Balijepalli, IV .. B01L 3/502715 |
| 2018/0151751 A1* | 5/2018 | Yeh ................... H01L 21/31116 |

\* cited by examiner

*Primary Examiner* — Jay C Chang
*Assistant Examiner* — Mikka Liu
(74) *Attorney, Agent, or Firm* — Green, Howard & Mughal LLP

(57) ABSTRACT

Transistor structures with a channel semiconductor material that is passivated with two-dimensional (2D) crystalline material. The 2D material may comprise a semiconductor having a bandgap offset from a band of the channel semiconductor. The 2D material may be a thin as a few monolayers and have good temperature stability. The 2D material may be a conversion product of a sacrificial precursor material, or of a portion of the channel semiconductor material. The 2D material may comprise one or more metal and a chalcogen. The channel material may be a metal oxide semiconductor suitable for low temperature processing (e.g., IGZO), and the 2D material may also be compatible with low temperature processing (e.g., <450° C.). The 2D material may be a chalcogenide of a metal present in the channel material (e.g., $ZnS_x$ or $ZnSe_x$) or of a metal absent from the channel material when formed from a sacrificial precursor.

17 Claims, 13 Drawing Sheets

TRANSISTOR CHANNEL PASSIVATION WITH 2D CRYSTALLINE MATERIAL

BACKGROUND

A thin-film transistor (TFT) is a class of field-effect transistors (FETs) in which a channel semiconductor material is a deposited thin film rather than a surface layer of a monocrystalline substrate material. Group IV materials (e.g., Si, Ge) may be employed in TFTs, but metal oxide semiconductors are also promising channel materials for TFTs.

Demand for integrated circuits (ICs) in portable electronic applications has motivated greater levels of semiconductor device integration. If a thin film semiconductor material can be deposited at relatively low temperatures (e.g., below 450° C.), one or more transistor device levels may be integrated monolithically with one or more other device levels that may include other TFTs or even other FETs that have been fabricated within a bulk semiconductor layer.

Many TFT channel semiconductor materials suffer high surface leakage relegating the transistors to long channel lengths, which limit TFT performance. Device leakage may be reduced if passivation of the channel material can be improved. Passivation material employed in TFT technology is often a non-native dielectric material deposited, for example, by chemical vapor deposition (CVD) or atomic layer deposition (ALD). These techniques involve directly contacting the channel material with deposition precursors, which may degrade the channel material by inducing changes in the channel material composition either during the passivation deposition process, or subsequent to deposition of the passivation material (e.g., over time and/or additional processing). Depositing a dielectric material specifically selected for the task of passivating a TFT channel semiconductor material often also negatively impacts device scaling because of thin film thickness build up.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
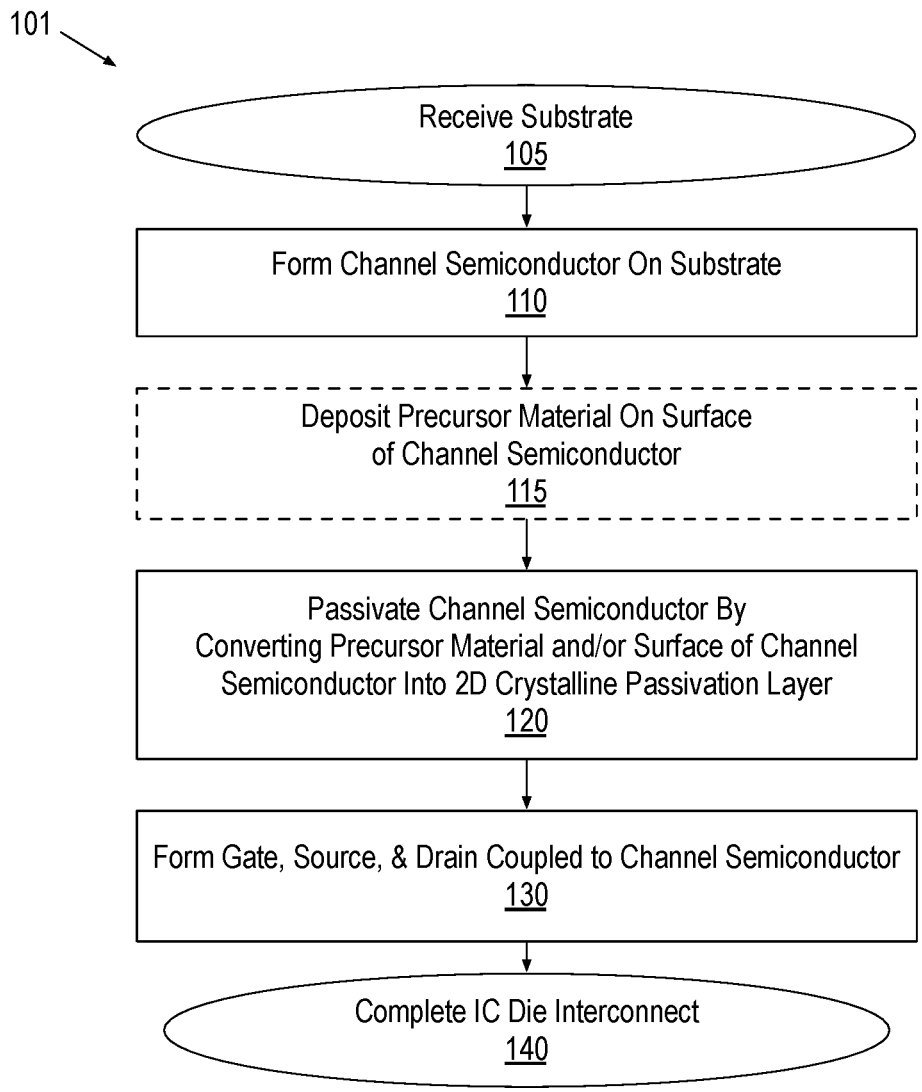
FIG. 1 is a flow diagram illustrating methods of fabricating transistor structures to include a 2D passivation material, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein a transistor structures that include a semiconductor material operable as a channel, and further include a two-dimensional (2D) passivation material in contact with any portion of the channel semiconductor material that is not otherwise contacted by a device terminal. The 2D channel passivation material may passivate any surface of a semiconductor material that includes a portion operable as a channel of a transistor. The 2D channel passivation material may be in contact with the channel semiconductor material where it is not otherwise covered by a gate electrode or contacted by source or drain terminal. Such 2D passivation material may reduce electrical leakage to/from one or more of the transistor terminals stemming from either surface states of the channel semiconductor material or compositional changes within the channel semiconductor material that would otherwise occur in absence of the 2D passivation material.

In accordance with some embodiments herein, a 2D passivation material has crystalline structure (i.e., long range atomic ordering) within the 2D plane of the material monolayer(s). The crystalline structure, along with the atomic species participating in the crystalline structure, imparts the 2D passivation material with a band gap that renders the material an electrical semiconductor, albeit a potentially wide band gap semiconductor. Depending on the number of atomic species, the 2D passivation material may have a few monolayers, for example with a first atomic species in a first monolayer, a second atomic species in a second monolayer, a third atomic species in a third monolayer, etc. More than one atomic species may also be interspersed at different 2D lattice sites within a single monolayer. Although the number of monolayers is not limited to a single monolayer, in accordance with exemplary embodiments herein, a 2D passivation material has a thickness less than 10 nm, and advantageously less than 6 nm (e.g., 2-5 nm). The 2D passivation material may therefore have a thickness of significantly less than 10 monolayers (e.g., two, three, or four monolayers).

Although having a thickness of only a few monolayers, a 2D passivation material preferably has good temperature stability, and may act to enhance the temperature stability of the channel semiconductor material beyond what it would be in absence of the 2D passivation material. For example, the channel semiconductor material may be a metal oxide semiconductor suitable for low temperature processing (e.g., <450° C.), which often displays relatively low thermal stability with semiconducting properties degrading over time and/or thermal cycles. The presence of the 2D passivation material may improve the thermal stability of the metal oxide channel semiconductor material. The improved thermal stability may be accompanied by reduced device leakage, but need not be.

In some examples, the 2D passivation material has hexagonal crystal structure. The c-plane may be substantially in a plane of the 2D monolayer(s), for example. The 2D passivation material may have inversion symmetry, or not, depending on whether there is asymmetry in the atomic species between adjacent monolayers. Notably, the crystalline structure of a 2D passivation material in accordance with embodiments herein need not be monocrystalline, but may instead be polycrystalline with discontinuities extending through the monolayers to define grain boundaries where the crystalline order within one grain of 2D material is disrupted. In some exemplary embodiments, grains within a 2D passivation material all have the full thickness of the 2D material with no two grains being stacked one atop the other. Hence, even when polycrystalline, each grain is two-dimensional, and the multi-grained material remains two-dimensional.

In accordance with some embodiments, a 2D passivation material has a band gap wide enough to be classified as at least a semiconductor material rather than a pure electrical conductor. The 2D passivation material is to be distinguished from a channel semiconductor material in that an applied gate bias voltage associated with operation of a transistor does not also induce a conductive channel with in the 2D passivation material. To the contrary, a 2D passivation material is to present a barrier to the transport of charge carriers through the 2D passivation material and/or at the interface of the 2D passivation material and a channel semiconductor material. For embodiments where a 2D passivation material is a semiconductor, the 2D passivation material advantageously has a bandgap offset from one or more bands of the channel semiconductor material. For example, in embodiments where a transistor is an n-type device and charge carriers comprise electrons, the 2D passivation material may have a conduction band offset from the channel semiconductor material that presents a significant barrier to electrons entering the 2D passivation material, confining the carriers instead to the channel semiconductor material. In other embodiments where a transistor is a p-type device and change carriers comprise electron holes, the 2D passivation material may have a valence band offset that similarly presents a significant barrier to holes entering the 2D material from the channel semiconductor material.

FIG. 1 is a flow diagram illustrating fabrication methods 101, in accordance with some embodiments. Methods 101 begin at block 105 where a substrate is received. The substrate may advantageously include a monocrystalline semiconductor layer, such as a silicon layer, upon which front-end-of-line (FEOL) FETs may be fabricated, for example upstream of methods 101. In some embodiments, the substrate received may include FEOL FETs of any architecture that have been fabricated using any technique, and that are interconnected with one or more metallization levels to form FEOL circuitry. In some examples, the FEOL FETs include both n-type and p-type FETs interconnected into a CMOS FEOL circuit. Although the substrate received at block 105 may include FEOL FETs, in other embodiments, the substrate received includes no prefabricated transistors or any other active microelectronic devices.

Methods 101 continue at block 110 where a channel semiconductor material is formed on the substrate. The material deposited at block 110 may have any semiconductor material composition that is suitable for an active channel region of a transistor, and is therefore referred to herein as "channel material." In some embodiments, the channel semiconductor comprises a thin film material that is formed by a thin film deposition technique suitable for the semiconductor composition desired for the channel of a transistor. A thin film channel semiconductor material may be semiconducting substantially as-deposited, and/or following some non-reactive thermal anneal of a deposited thin film material. The channel material may be deposited by any technique suitable for a desired material composition and microstructure. For example, the channel material may be deposited at block 110 by physical vapor deposition (PVD), CVD, ALD, or molecular beam epitaxy (MBE). For some exemplary low temperature embodiments processing temperatures are not to exceed 450° C., with deposition of the channel material at block 110 advantageously below 400° C., and may be 350° C., or less.

The thickness regime associated with deposition processes suitable for directly depositing a thin film channel semiconductor material at block 110 may be practically limited by the deposition process to material thicknesses that are over 10 nm, for example. In some exemplary embodiments, channel material is deposited to less than 50 nm, advantageously less than 20 nm (e.g., 10-20 nm). As such, the channel material may be deposited at block 110 to a thickness exceeding that of a 2D passivation material (e.g., exceeding 10 nm) that is subsequently formed over a surface of the channel material.

In some embodiments, the channel material deposited at block 110 comprises predominantly silicon (e.g., substantially pure Si), predominantly germanium (e.g., substantially pure Ge), or an alloy comprising a Group IV majority constituent (e.g., SiGe alloys, GeSn alloys). In other embodiments, the channel material deposited at block 110 is a Group III-V material comprising a Group III majority constituent and a Group IV majority constituent (e.g., InGaAs, GaAs, GaSb, InGaSb). In some exemplary low temperature embodiments, the channel material deposited at block 110 is an oxide semiconductor. An oxide semiconductor can have good transistor channel characteristics, for example offering high carrier mobility and a tunable material band gap and resistivity. Oxide semiconductor materials can also be formed at low temperatures (e.g., <450° C.). Oxide semiconductor materials primarily include one or more metals, and oxygen. The metal(s) may be from the transition metals (e.g., IUPAC group 4-10) or post-transition metals (e.g., IUPAC groups 11-15). The metal oxide compounds may be suboxides ($A_2O$), monoxides (AO), binary oxides ($AO_2$), ternary oxides ($ABO_3$), and mixtures thereof. In advantageous embodiments, the channel materials deposited at block 110 includes oxygen and at least one of Mg, Cu, Zn, Sn, Ti, In, or Ga.

In some specific embodiments, the channel material deposited at block 110 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is too low, and a pure insulator if x is too high). In some other embodiments, the oxide semiconductor deposited at block 110 comprises a zinc oxide ($ZnO_x$), such as Zn(II) oxide, or ZnO. In other embodiments, the zinc oxide is zinc peroxide ($ZnO_2$) or a mixture of ZnO and $ZnO_2$, where x may range between 1 and 2. In some embodiments, the oxide semiconductor material deposited at block 110 comprises $ZnO_x$ doped with In and Ga, for example. In some such embodiments, the oxide semiconductor deposited at block 110 is $InGaO_3$ (ZnO), often referred to as IGZO. In some other embodiments, the oxide semiconductor deposited at block 110 comprises titanium oxide ($TiO_x$). Exemplary oxide semiconductors that may have suitable p-type conductivity include copper oxide ($CuO_x$). In some $CuO_x$ embodiments, the oxide semiconductor deposited at block 110 is Cu(I) oxide, or $Cu_2O$. In other embodiments, oxide semiconductor deposited at block 110 is Cu(II) oxide (CuO) or a mixture of CuO and $Cu_2O$, where x may range between 0.5 and 1.

Alternatively, a 2D channel material in a lower thickness regime may be formed at block 110. For such embodiments, the channel semiconductor may have a thickness on the same order as that of a 2D passivation material (e.g., less than 10 nm) that is subsequently formed over a surface of the channel material. Therefore, the channel material may also be a 2D material layer. In some such embodiments, the channel semiconductor material is a metal chalcogenide. Metal chalcogenides are compounds that may include a wide variety of d-block and/or p-block metal elements along with one or more chalcogen elements (S, Se, or Te). A metal chalcogenide channel semiconductor may be a dichalcogenide ($MC_2$). However, the channel material need not be a dichalcogenide because a number of oxidation states are possible such that the resulting compound is better characterized as $MC_x$. In some advantageous embodiments, x is between 0.2 and 4.

Channel material deposited at block 110 may have either p-type or n-type conductivity and may be intentionally doped (e.g., p-type or n-type), or not (i.e., intrinsic). Compared to intrinsic material that is not intentionally doped, n-type and p-type channel material may have a higher concentration of impurities. Electrically active dopants, such as elements introducing excess electrons, electron vacancies, or oxygen vacancies, may be introduced as a means of tuning the semiconducting properties of the channel material deposited at block 110. Dopant levels in channel semiconductor material deposited at block 110 may be selected to arrive at a desired threshold voltage associated with gating the channel region of a transistor, for example.

Channel material deposited at block 110 may have any morphology or microstructure. In some embodiments, channel material deposited at block 110 has crystallinity. Depending on the substrate and the processes employed at block 110, the channel material may be substantially monocrystalline, or it may be polycrystalline (e.g., microcrystalline or nanocrystalline). If polycrystalline, the crystallinity may further comprise a texture, or not. The channel material may also lack crystallinity (i.e., having no discernable long-rang order) and is substantially amorphous.

Methods 101 continue with the formation of a 2D passivation material over exposed surfaces of the channel semiconductor material. For embodiments where the channel semiconductor was compatible with low temperature processing the 2D passivation material is advantageously also compatible with low temperature processing (e.g., <450° C.) and may be formed with one or more techniques that avoid degradation of a temperature sensitive channel semiconductor material.

In accordance with some exemplary embodiments, passivation of a channel semiconductor material entails a reactive conversion of a surface layer or portion of the channel material into a distinct material suitable for passivation of the underlying channel material that is not converted. Such "self-passivation" embodiments may be advantageous where the channel semiconductor material has a composition that can be reacted into a suitable 2D passivation material. Self-passivation techniques have the advantage of avoiding the need for additional material depositions.

In accordance with other exemplary embodiments, passivation of a channel semiconductor material entails the conversion of a sacrificial precursor material that is first deposited over, or on to, the channel semiconductor material. A precursor material may be deposited over the channel semiconductor material, for example as a thin film, using any thin film deposition technique suitable for a desired material composition. The precursor material is then consumed in a conversion process with a resulting 2D passivation material forming an interface with the underlying channel semiconductor material. Such embodiments may be advantageous where the channel semiconductor material cannot be readily converted into a suitable 2D passivation material. As shown in FIG. 1, methods 101 may therefore optionally include a precursor deposition block 115 where a precursor material distinct from the channel material is deposited. Alternatively, block 115 may be skipped. Methods 101 continue at block 120 where a portion of the channel semiconductor is converted into the 2D passivation material, or a sacrificial precursor is alternatively converted into the 2D passivation material.

In some exemplary embodiments, the 2D passivation material formed at block 120 is a metal chalcogenide. The metal chalcogenide passivation material may be formed from a metallic channel semiconductor material that was deposited at block 110, or from a metallic precursor material that was deposited at block 115, for example. Any channel semiconductor formed at block 110 that comprises one or more metal species may be suitable for partial conversion into a 2D metal chalcogenide passivation material at block 120. Alternatively, any deposition technique (e.g., PVD, MBD, MOCVD) may be employed at block 115 to deposit a thin film of substantially pure elemental metal, metal alloy, or metallic compound (e.g., metal oxide) that is suitable for subsequent conversion into a metal chalcogenide. The metallic precursor material may be deposited to film thicknesses controlled to tens or hundreds of monolayers, for example. In some embodiments, the metallic precursor material is deposited to a thickness of 5-15 nm.

In a self-passivation or sacrificial precursor conversion process, a chalcogen may be introduced into the sacrificial precursor material and/or channel semiconductor material that comprises suitably reactive metal(s). The chalcogen elements introduced at block 120 may include at least one of sulfur, selenium or tellurium (oxygen is excluded), with the inventors having found S or Se to be particularly advantageous. In some exemplary embodiments, block 120 entails a thermal process performed in the presence of S, Se or Te. In some examples, the sacrificial precursor material or an exposed surface of the channel material is heated to over 100° C. (e.g., 125° C., 150° C., 200° C., 250-1000° C.) in the presence a reactive species for a predetermined time. The reactive species may be delivered as a gas of various compositions, with some examples including $H_2S$, $H_2Se$, $H_2Te$. As these examples can also act as strong reducing agents, they may be combined or replaced with weaker reducing agents/stronger oxidizing agents. For example, in some embodiments $SO_2$ or $SeO_2$ is introduced in combination with, or to the exclusion of, $H_2S$ or $H_2Se$, respectively, with gases lacking oxygen tempering the reducing strength somewhat less than those that introduce oxygen. Other gases, such as, $NH_3$, $N_2$, Ar, $N_2O$, or $S_xO_y$, $Se_xO_y$, $Te_xO_y$, with x or y being 1, 2 (e.g., $SO_2$, $SeO_2$) or 3, or $SF_z$, $Se_z$ or $Te_z$ with z either 4 or 6 (e.g., $SF_6$, $TeF_6$) may also be introduced in combination with one or more of $H_2S$ and, $H_2Se$ and or $H_2Te$.

Conversion of a sacrificial precursor material or a surface layer of a channel semiconductor material into a chalcogenide may occur in any manner than renders a 2D crystalline metal chalcogenide layer in contact with underlying channel semiconductor material. Following conversion, the 2D metal chalcogenide material may have a thickness of only a few monolayers (e.g., less than 10 nm) and may be crystalline throughout this thickness.

A metal chalcogenide formed at block 120 may be a semiconductor having either p-type or n-type conductivity. A metal chalcogenide 2D passivation material may be a dichalcogenide ($MC_2$). However, just as for a channel semiconductor material, a 2D passivation material need not be a dichalcogenide because a number of oxidation states are possible such that the resulting compound is better characterized as $MC_x$. In some advantageous embodiments, x is between 0.2 and 4. The 2D passivation material may be any metal chalcogenide that has a sufficiently wide band gap and/or bandgap offset from the channel semiconductor material. In some embodiments, one or more d-block or p-block metals present within a channel semiconductor material or within a sacrificial precursor material is converted into the metal chalcogenide, $MS_x$, $MSe_x$, or $MTe_x$ at block 120. For example, a metal M1 (e.g., Cu, Zn, Zr, Re, Hf, Ir, Ru, Cd, Ni, Co, Pd, Pt, Ti, Cr, V, W Mo, Al, Sn, Ga, In, B, Ge, Si, P, As, or Sb) may be reacted with S, Se or Te to generate $M1S_x$, $M1Se_x$, or $M1Te_x$, respectively.

As noted above, channel semiconductor material formed at block 110 may be a metal oxide comprising predominantly one or more metals and oxygen (e.g., IGZO), and block 115 may be skipped where such a metal oxide may be partially converted into suitable a 2D passivation material when exposed to the reactive conversion process at block 120. For metal oxide semiconductors, one metal constituent of the compound may preferentially segregate into a 2D passivation material layer more than other constituents, for example as a result of having the lowest energy of formation. As one example, the inventors have found that exposing an IGZO channel semiconductor material to $H_2S$ at temperatures over 200° C. will generate at the surface of the IGZO a 2D material comprising predominantly $ZnS_x$. Hence, compared to In and Ga, a lower energy of formation for ZnS results in a segregation of Zn from the channel semiconductor material into the 2D passivation material. The level of segregation experienced by metals of any given metal oxide channel material may differ significantly from the IGZO channel/ZnS passivation example. However, any segregation that arrives at a passivation material composition having a sufficient band gap and/or sufficient band gap offset (e.g., at least 1.5 eV) from the channel semiconductor may be suitable. The band gap of the passivation material and/or the channel semiconductor may be evaluated, by photoluminescence (PL), and/or Ramen spectrometry, for example, to arrive at a suitable channel/passivation material system that may advantageously also display reduce electrical leakage at a transistor device level.

A chalcogenide-based self-passivation of a channel metal oxide semiconductor will consume some portion of the channel semiconductor material, for example from an as-deposited thickness at block 110 to a passivated thickness at block 120. As one example, a 20 nm IGZO material layer may be converted into a 16-17 nm IGZO material layer covered with a 3-4 nm $ZnS_x$ material layer. Passivation process parameters, such as process time, process temperature, or reactive species partial pressure, may be varied at block 120 to modulate the passivation layer thickness from 1 nm and up. Passivation process parameters may also modulate the passivation layer composition (e.g., by introducing various chalcogen carriers and/or reducing agents) to achieve a sufficiently wide band gap and/or a sufficiently large band gap offset from the channel semiconductor to achieve adequate passivation of the underlying channel material. In the IGZO channel/ZnS passivation example, the inventors have found the 2D ZnS material generated from IGZO to have a sufficiently large band gap and/or conduction band offset relative to IGZO for the 2D ZnS material to function well as a passivation of the IGZO. Noting metal content of a channel material may be altered by the passivation process (e.g., Zn reduced), the composition of the channel semiconductor material formed at block 110 may be predetermined (e.g., Zn enriched) to arrive at a passivated channel material of a desired passivated channel composition that displays suitable semiconducting properties following passivation block 120.

Metal chalcogenide passivation material may be more thermally stable than many channel semiconductor materials. For example, the inventors have found some oxide semiconductors, such as $ZnO_x$ and IGZO, decompose at elevated temperatures (e.g., above 250° C.-300° C.). As a result, semiconducting properties of such materials may be lost during subsequent IC fabrication processes. However, passivating a surface portion of such materials into a chalcogenide can help the channel material survive subsequent processing temperatures in excess of 400° C. (e.g., 500° C.-800° C.) and/or the subsequent introduction of materials that would otherwise tend to adversely modulate oxygen content within the channel material.

Among semiconducting d-block metal chalcogenides, those with Group IIB/Group 12 metals (Zn Group) may be significantly more stable than those with other d-block metals. Hence, in embodiments where a d-block chalcogenide is formed, the subset including Zn Group metals may be particularly advantageous at least for their stability. Although not bound by theory, the improved thermal stability of Zn Group chalcogenides may be attributable to their completely filled d-orbital. With s-orbital electrons playing a more significant role, the properties of semiconducting Zn Group chalcogenides may be more akin to p-block metal chalcogenides than to the other d-block metal chalcogenides.

Although the IGZO/ZnS system described above is one example illustrative of chalcogenide-based passivation, a channel material comprising another metal oxide semiconductor may be similarly self-passivated. For example, where a channel material is an oxide of one or more metals (M1, M1M2, M1M2M3, etc.), at least a portion of the metal oxide may be converted to a 2D metal chalcogenide at block 120 by replacing oxygen with any of sulfur, selenium, or tellurium. For example, any $InO_x$, $GaO_x$, or $ZnO_x$ semiconductor deposited at block 110 may be reacted with one or more of S, Se or Te at block 120 to generate $InS_x$ or $InSe_x$, $GaS_x$ or $GaSe_x$, $ZnS_x$ or $ZnSe_x$. In some embodiments, in the passivation material both sulfur and selenium may replace oxygen (e.g., $M_1S_xSe_{1-x}$, $M_1M_2S_ySe_{1-x}$, etc.). In other embodiments, any combination of sulfur, selenium and tellurium may replace oxygen in a metal oxide channel semiconductor material to form a 2D metal chalcogenide passivation material.

In alternative embodiments where the passivation process performed at block 120 converts a sacrificial precursor deposited at block 115 into a metal chalcogenide ($MC_x$) passivation material, the precursor material may comprise predominantly the metal M from which the chalcogenide is to be formed. For example, a metal M1 (e.g., Cu, Zn, Zr, Re, Hf, Ir, Ru, Cd, Ni, Co, Pd, Pt, Ti, Cr, V, W Mo, Al, Sn, Ga, In, B, Ge, Si, P, As, or Sb) may be reacted with S, Se or Te to generate $M1S_x$, $M1Se_x$, or $M1Te_x$, respectively. For example, any of $CuS_x$, $CuSe_x$, $CuTe_x$, $ZnS_x$, $ZnSe_x$, $ZnTe_x$, $ZrS_x$, $ZrSe_x$, $ZrTe_x$, $ReS_x$, $ReSe_x$, $TeSe_x$, $RuS_x$, $RuSe_x$, $RuTe_x$, $IrS_x$, $IrSe_x$, $IrTe_x$, $CdS_x$, $CdSe_x$, $CdTe_x$, $NiS_x$, $NiSe_x$, $NiTe_x$, $CoS_x$, $CoSe_x$, $CoTe_x$, $PdS_x$, $PdSe_x$, $PtSe_x$, $PtS_x$, $PtSe_x$, $PtTe_x$, $TiS_x$, $TiSe_x$, $TiTe_x$, $CrS_x$, $CrSe_x$, $CrTe_x$, $VS_x$, $VSe_x$, $VTe_x$, $WS_x$, $WSe_x$, $WTe_x$, $MoS_x$, $MoSe_x$, $MoTe_x$, $AlS_x$, $AlSe_x$, $AlTe_x$, $SnS_x$, $SnSe_x$, $SnTe_x$, $GaS_x$, $GaSe_x$, $GaTe_x$, $InS_x$, $InSe_x$, $InTe_x$, $SbS_x$, $SbSe_x$, $SbTe_x$, $GeS_x$, $GeSe_x$, $GeTe_x$, $SiS_x$, $SiSe_x$, or $SiTe_x$ may be formed at block 120 as a function of the metal or metal alloy formed at block 115. Similarly, M1M2 or M1M2M3 alloys may be reacted with one or more of S, Se, or Te. For example, a linear combination of InGaZn deposited at block 115 may be converted into $InGaZnSe_x$ at block 120. Alloys including metalloids or non-metals from the p-block may also be reacted with S, Se, or Te. For example, InZnP deposited at block 115 may be converted into $InZnPSe_x$ at block 120.

The metallic precursor deposited at block 115 may therefore include one or more d-block or p-block elements. Suitable d-block transition metals include Old IUPAC Groups IIIA-IIB/New IUPAC Groups 3-12. Suitable p-block elements include the metal side of Old IUPAC Groups IIIB/New IUPAC Group 13 through Old IUPAC Group VIB/New IUPAC Group 16). A precursor material deposited at block 115 may also include the metalloids (e.g., As) and non-metals (e.g., P) of the p-block elements as constituents of an alloy that further comprises a d-block and/or p-block metal. In metal alloy embodiments, the metallic precursor material includes significant amounts of two or more such metals (e.g., in the form of a binary alloy or ternary alloy). The alloys may be any linear combination of the constituents. For example, a binary alloy $M1_yM2_{1-y}$ may include any atomic percent of a first metal (M1) and a complementary atomic percent of a second metal (M2), or metalloid/non-metal. A ternary alloy $M1_yM2_zM3_{1-y-z}$ may include any atomic percent of metal M1, any atomic percent of metal M2, and a complementary atomic percent of a third metal (M3), or metalloid/non-metal such that y and z are both greater than 0, but sum to less than 1. One exemplary alloy mixture is approximately equal parts of M1, M2 and M3 (1:1:1).

In some further embodiments, the metallic precursor material is an oxide of one or more metals (M1, M1M2, M1M2M3, etc.), and this metal oxide is converted to the metal chalcogenide passivation material at block 120. As described above, the chalcogen may replace oxygen in the compound. For example, $InO_x$, $GaO_x$, $ZnO_x$, or IGZO deposited at block 115 may be reacted with one or more of S, Se or Te at block 120, for example to generate $InS_x$ or $InSe_x$, $GaS_x$ or $GaSe_x$, $ZnS_x$ or $ZnSe_x$, $IGZS_x$ or $IGZSe_x$. Hence, multiple metal oxide materials may be deposited. A first metal oxide suitable as a channel material (IGZO) may be deposited at block 110, and a second metal oxide suitable for conversion into a passivation material (e.g., $ZnO_x$) may be deposited at block 115. During the passivation process at block 120, the second metal oxide is converted into the 2D passivation material (e.g., $ZnS_x$). Oxygen from conversion of the second metal oxide may either become liberated during the conversion process or be driven into the channel material to arrive at some passivated channel semiconductor composition.

For any of the embodiments where 2D passivation material is formed from a metallic precursor, the 2D passivation material may, but need not, include one or more element that is also present in the channel semiconductor material. As such, precursor conversion embodiments may offer greater freedom to tune the band gap and/or offset of the 2D crystalline passivation material relative to the channel semiconductor material. For example, where the channel semiconductor material is a metal oxide, a 2D passivation material may, but need not, include one or more of the metal elements in the channel metal oxide as a function of whether the precursor material included the same metal element(s) as the channel semiconductor material. Hence, from embodiments where channel semiconductor material comprises IGZO, a precursor that includes Zn (e.g., $ZnO_x$) may be converted into a 2D crystalline $ZnS_x$ passivation material so that both the channel semiconductor and the channel passivation material comprise Zn. For other embodiments where channel semiconductor material comprises IGZO, a precursor that lacks Zn may be converted into a 2D crystalline $MS_x$ passivation material. For a precursor that also lacks In and Ga, the resulting 2D crystalline passivation material would comprise only metal element(s) absent from the channel semiconductor material.

The 2D passivation material formed at block 120 may also be other than a metal chalcogenide. In one alternative embodiment, the 2D passivation material formed at block 120 includes one or more of carbon or nitrogen. Such materials should again have a sufficiently wide bandgap and/or band offset from a channel semiconductor material to provide adequate surface passivation of the channel semiconductor. In some examples, a hexagonal layered carbide, nitride, or carbonitride of a transition metal (e.g., Ti, V, Nb, Cr) may be formed at block 120 as the 2D passivation material. Such crystalline nitrides, carbides and carbonitrides may also comprise multiple metals (e.g., two transition metals).

A 2D passivation material may also include one or more dopants (e.g., in concentrations up to $1e^{21}$ atoms/cm$^3$). Exemplary dopants include N, O, H, F, Cl, Si, Ge, or trace levels of metals, some of which may be readily detected along with the major constituents by one or more chemical analysis techniques (e.g., X-ray photoelectron spectroscopy (XPS)).

A self-passivation or sacrificial precursor conversion process practiced at block 120 may be self-limiting. For example, formation of 2D crystalline chalcogenide passivation material on a surface of metal oxide channel material may retard further formation of chalcogenide below the surface. Whether self-limiting or not, the 2D passivation material formed in accordance with embodiments herein may have a thickness of only 2-3 monolayers. This thickness regime may be significantly below a thickness control threshold associated with deposition processes suitable for directly depositing a thin film passivation material. Hence, whereas TFT channel material thicknesses may be practically limited by a deposition process to material thicknesses that are over 10 nm, methods 101 may yield various 2D passivation material layers in a lower thickness regime, for example one that advantageously ranges from 0.3 nm to 10 nm.

Methods 101 continue at block 130 with the formation of transistor terminals, and methods 101 may then end with completion of IC die interconnection, for example to couple terminals of multiple transistors into circuitry. In some such embodiments, at block 140 BEOL metal chalcogenide transistor circuitry is electrically interconnected to FEOL Group IV (e.g., Si or SiGe) circuitry through one or more metallization levels. Notably, block 130 may be performed before or after blocks 110, 115 and/or 120. Hence, while in FIG. 1 illustrates the formation of a gate terminal, source terminal and drain terminal following passivation of the channel material, one or more transistor terminals may instead be formed prior to formation of a 2D passivation material. For example, in some embodiments a gate electrode may be formed over a channel material, then regions of the channel material not covered by the gate electrode may be passivated, and then source and drain terminals may be formed to the channel material through the passivation material. In another example, all terminals of a transistor structure may be formed prior to the passivation of the channel material. In still other embodiments, all terminals of a transistor structure may be formed prior to formation of a channel semiconductor material with passivation of that channel semiconductor material performed subsequently. As the ordering of the blocks 110, 115, 120 and 130 may be varied to arrived at particular transistor structures, a number of exemplary transistor structures including a 2D passivation layer that may be formed in accordance with various implementations of methods 101 are further described below.

Figure 2:
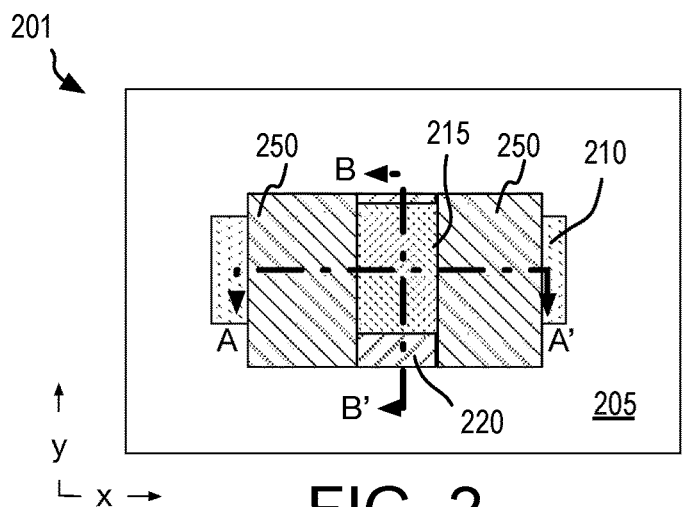
FIG. 2 is a plan view of a transistor structure including a 2D passivation material, in accordance with some embodiments.

FIG. 2 is a plan view of a transistor structure 201 including a 2D passivation material, in accordance with some embodiments. In FIG. 2, heavy dot-dashed lines denote planes A-A' and B-B' along which cross-sectional views are further provided for various embodiments described below. Transistor structure 201 may be arrayed over an area of a device layer within IC die, for example. Transistor structure 201 is a FET with a source terminal, a drain terminal, and a gate terminal, in accordance with some illustrative embodiments. These terminals are at least in part electrically coupled through a channel semiconductor material that may have one or more of the attributes described above in the context of methods 101, for example. Transistor structure 201 may be a planar FET, or a non-planar FET. Non-planar examples include a FinFET, Tri-Gate, and omega-gate. Whether planar or non-planar, the channel carrier conduction may be laterally oriented in the plane of a device layer (e.g., transistor structure 201) or vertically oriented, for example as described further below.

In FIG. 2, transistor structure 201 includes a channel semiconductor material 210 extending over an area of a substrate 205. Although only one body of channel semiconductor material 210 is illustrated in FIG. 2, a FET may include one or more bodies. Channel semiconductor material 210 may have any of the compositions described above, such as a metal oxide semiconductor, or a Group IV semiconductor, for example. In some embodiments, channel semiconductor material 210 is substantially monocrystalline, having some major and/or minor axes orientation(s) within the x-y plane of an underlying substrate. In other embodiments, channel semiconductor material 210 is polycrystalline, which may advantageously have texture that may also be characterized by some major and/or minor axes orientation(s) within the x-y plane. In some polycrystalline embodiments, semiconductor body 210 lacks any discernable texture.

A gate electrode 220 is over/underlaps a channel region of channel semiconductor material 210. Gate electrode 220 may include an elemental metal layer, a metal alloy layer, or laminate structure of either or both. Gate electrode 220 may have any composition suitable for a particular channel semiconductor material and target threshold voltage. As one example, gate electrode 220 includes a metal nitride, such as TiN, or other work function metal. The gate electrode may also comprise Al (e.g., TiAlN). Other alloy constituents may also be employed in gate electrode 220, such as, but not limited to C, Ta, W, Pt, and Sn. Additional metal(s) may be employed in a bulk conductor layer to reduce gate electrode electrical resistance.

With a lateral channel layout, source/drain metallization 250 is adjacent to gate electrode 220 and also intersects ends of channel semiconductor material 210 that are on opposite sides of gate electrode 220. Source/drain metallization 250 may be in direct contact with channel semiconductor material 210. Alternatively, there may be an intervening source/drain semiconductor (not depicted), which is further in contact with channel semiconductor material 210. Source/drain metallization 250 may include one or more metals that form an ohmic or tunneling junction directly to channel semiconductor material 210, or to an intervening source/drain semiconductor material. Source/drain metallization 250 may comprise any metal. Examples include Ti, W, Pt, their alloys, and nitrides. Source/drain semiconductor material, if present, may be any semiconductor material compatible with channel semiconductor material 210, such as, but not limited to, group IV semiconductors (e.g., Si, Ge, SiGe), and/or group III-V semiconductors (e.g., InGaAs, InAs), and/or group III-N semiconductors (e.g., InGaN), group II-VI semiconductors, or metal oxide semiconductors.

Figure 3A:
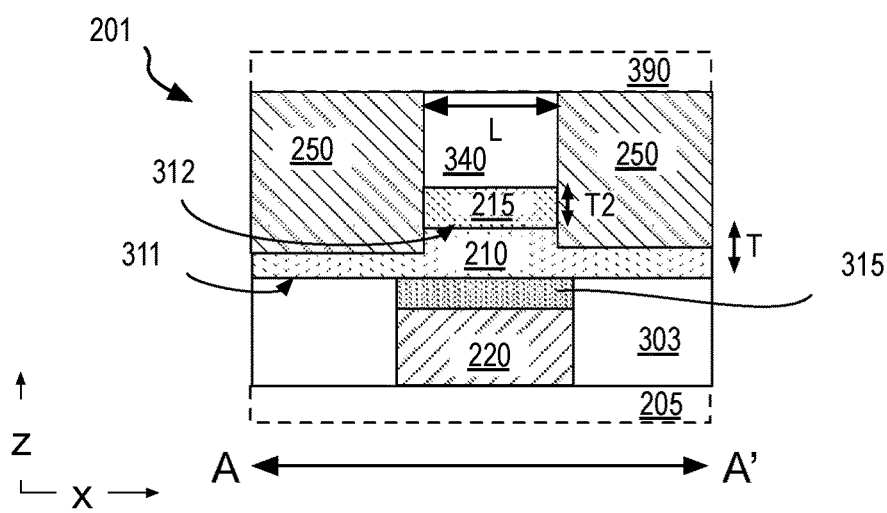
FIG. 3A is a cross sectional view of a transistor structure including a 2D passivation material along the A-A' line introduced in FIG. 2, in accordance with some embodiments.
Figure 3B:
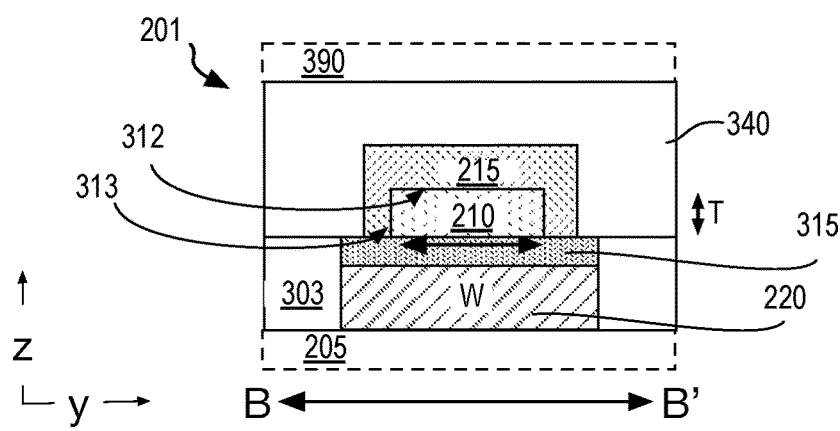
FIG. 3B is a cross sectional view of a transistor structure including a 2D passivation material along the B-B' line introduced in FIG. 2, in accordance with some embodiments.

As further shown in FIG. 2, FET structure 201 includes a 2D passivation material 215 in contact with channel semiconductor material 210. 2D passivation material 215 may have any of the attributes described above. FIG. 3A further illustrates FET structure 201 along the A-A plane denoted in FIG. 2. FIG. 3B further illustrates FET structure 201 along the B-B plane denoted in FIG. 2. As shown in FIGS. 3A and 3B, gate electrode 220 is on a bottom side of semiconductor channel material 210, and source/drain contact metallization 250 is on a top side of semiconductor channel material 210. Gate electrode 220 is embedded within a dielectric material 303, which may be any suitable material such as, but not limited to, silicon dioxide, silicon nitride, or silicon oxynitride, a low-k material having a relative permittivity below 3.5, for example, or a dielectric metal oxide. Dielectric material 303 is over substrate 205, which is illustrated in dashed line to emphasize that substrate 205 may include any number of FEOL material and/or circuitry levels. Similarly, source/drain contact metallization 250 is embedded within a dielectric material 340, which may be any suitable material (e.g., silicon dioxide, silicon nitride, or silicon oxynitride, or a low-k material). Any number of BEOL material and/or circuitry levels 390 may be over dielectric material 340.

In the "bottom-gate" architecture illustrated for FET 201, transistor channel length L is dependent on the spacing of source/drain contact metallization 250, which may be defined by some minimum lithographic feature resolution (e.g., 10-20 nm pitch). Length L is independent of gate length (e.g., x-dimension) in this bottom gate architecture, so channel gate electrode 220 may extend under source/drain metallizations 250 by an arbitrary amount, and may even be present over the entire area under semiconductor channel material 210. 2D passivation material 215 is in direct contact with a top surface 312 of channel semiconductor material 210, opposite bottom surface 311 that interfaces a gate dielectric 315. 2D passivation material 215 is in contact with top surface 312 over the entire lateral spacing between source/drain metallizations 250 and may therefore minimize any surface leakage between the metallization 250. With 2D passivation material 215 in contact with top surface 312, channel semiconductor 210 is protected from subsequent processing (e.g., the deposition of dielectric material 340). As further shown, bottom surface 311 of channel semiconductor material 210 is in contact with underlying dielectric material 303 (and gate dielectric 315). However, where channel semiconductor material 210 is formed subsequently to dielectric material 303 (and gate dielectric 315), channel semiconductor material 210 is not subjected the dielectric formation process(es). As such, the bottom surface 311 may be a more stable interface than top surface 312. Also, in the top-sided source/drain architecture of transistor 201, electric fields may be stronger at top surface 312 than at bottom surface 311. Channel material 210 may have any thickness T, but in some exemplary embodiments is at least 10 nm. As noted above, 2D passivation material 215 may have a thickness T2 of only a few monolayers (e.g., 0.5-9 nm). In some exemplary embodiments therefore, channel thickness T is larger than passivation thickness T2.

Gate dielectric 315 may be any material(s) suitable for the compositions of channel semiconductor material 210 and gate electrode 220. Together, gate electrode 220 and gate dielectric 315 are referred to as a gate stack. While any gate stack materials known to be suitable for a metal chalcogenide channel may be utilized, in some exemplary embodiments the gate stack includes a high-k dielectric material (with a bulk relative permittivity greater than 9), and a metal gate electrode having a work function suitable for semiconductor body 210. Exemplary high-k materials include metal oxide insulators, such as, but not limited to $GaO_x$, $AlO_x$ (comprising predominantly Al and O), $HfO_x$ (comprising predominantly Hf and O), $HfAlO_x$ (comprising predominantly Al, Hf, and O). Silicates, such as, but not limited to $HfSiO_x$, or $TaSiO_x$ may also be suitable. Although a MOSFET architecture is shown in FIG. 3, a bottom gate may be similarly employed in a MESFET structure where gate dielectric 315 is absent, and gate electrode 220 is instead in direct contact with semiconductor channel material 210.

As further illustrated in FIG. 3B, FET structure 201 has a channel width W associated with a second lateral dimension of channel semiconductor material 210. In the cross-section view shown 2D passivation material 215 is present a sidewall surface 313 of channel semiconductor material 210, which is indicative of passivation material 215 having been formed subsequent to a patterning of channel semiconductor material 210. In alternative embodiments where passivation material 215 is formed prior to patterning of channel semiconductor material 210, passivation material 215 may instead be absent from sidewall 313.

Figure 4:
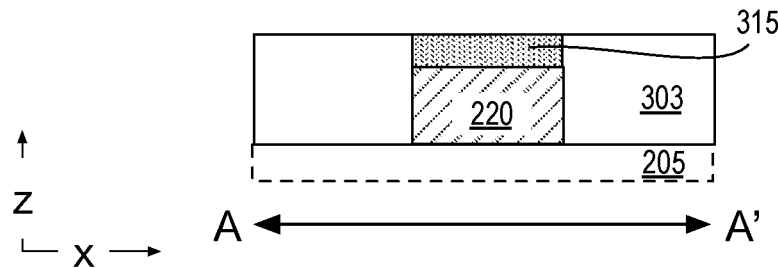
FIGS. 4, 5A, 5B, 6, 7, 8 and 9 are cross-sectional views of a transistor structure evolving to include a 2D passivation material, in accordance with some embodiments.
Figures 5A, 5B:
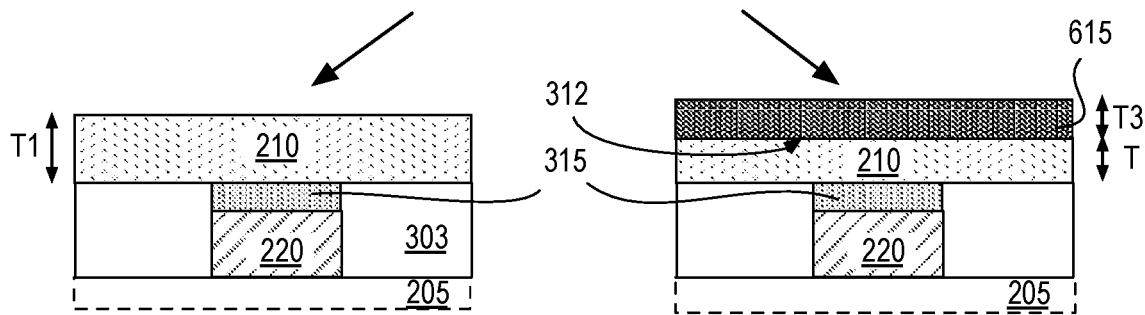
Figure 6:
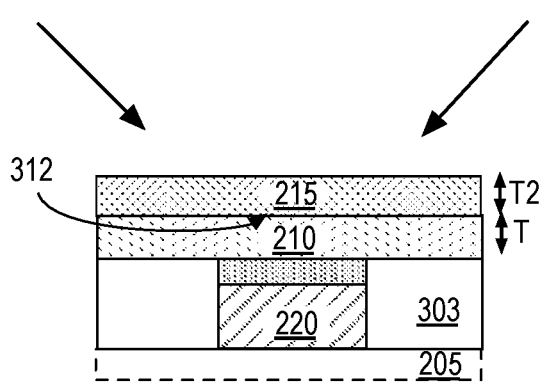

FIGS. 4, 5A, 5B, 6, 7, 8 and 9 are cross-sectional views of transistor structure 201 evolving to include 2D passivation material 215, in accordance with some embodiments of methods 101 (FIG. 1). Referring first to FIG. 4, a gate stack (e.g., gate electrode 220 and gate dielectric 315) is formed over substrate layer(s) 205. In some embodiments shown in FIG. 5A, channel semiconductor material 210 is deposited to an initial ("as-deposited") thickness T1 over the gate stack. In some other embodiments shown in FIG. 5B, channel semiconductor material 210 is deposited over the gate stack to thickness T and then a sacrificial precursor material 615 is deposited over an exposed top surface 312 of channel semiconductor material 210 to some predetermined thickness T3. A passivation process performed according to methods 101 will passivate the structures shown in FIG. 5A to arrive at the structure shown in FIG. 6. Upon converting a portion of channel semiconductor material 210 into 2D passivation material 215 having a thickness T2, the passivated top surface 312 has advanced toward the gate stack so that channel semiconductor material 210 then has a passivated thickness of T, which is less than the initial channel thickness T1. A passivation process performed according to methods 101 will alternatively passivate the structures shown in FIG. 5B to arrive at the same structure shown in FIG. 6. For example, upon converting substantially all of a sacrificial precursor material 615 into 2D passivation material 215 of thickness T2, the channel semiconductor material 210 has a passivated thickness of T.

Figure 7:
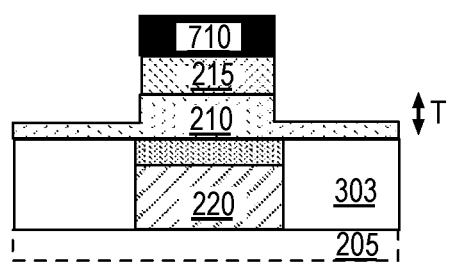
Figure 8:
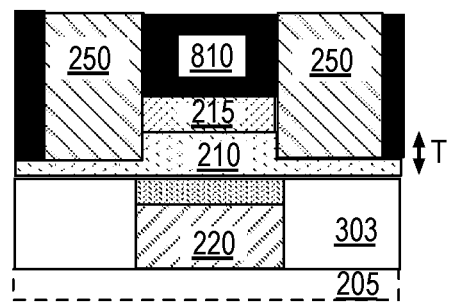
Figure 9:
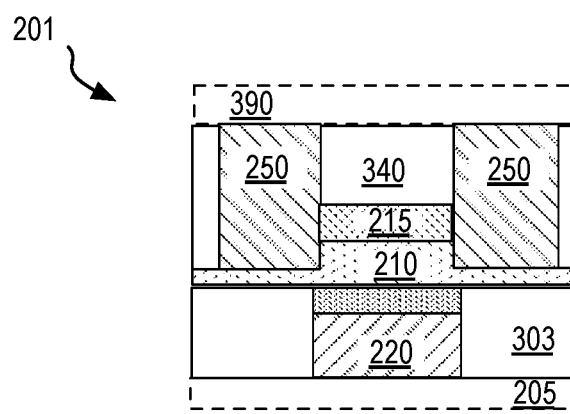

Following passivation of channel semiconductor material 210, a channel portion of the transistor structure may be patterned according to any suitable mask 710, as shown in FIG. 7. In this example, passivation material 215 is etched with any suitable process, exposing channel semiconductor material 210 where source and/or drain terminals are to be formed. Source and drain contact metallization are then formed to contact channel semiconductor 210. In the example illustrated in FIG. 8, another mask 810 is formed over 2D passivation material 215 and source/drain contact metallization 250 is deposited within openings of mask 810. A lift-off process or planarization process, for example, may be utilized to pattern source/drain metallization 250 into any suitable contact structure. As shown in FIG. 9, transistor structure 201 is substantially complete upon replacing the source/drain contact metallization mask material with dielectric material 340 and completing any upper level metallization level 390.

The plan view of FET structure 201 is applicable to a number of alternative transistor architectures, some of which are further described in the context of FIG. 10-14. For the sake of clarity, reference numbers are repeated for features that may share the same attributes (e.g., material composition, morphology, etc.) as those introduced in FIG. 2A-2C.

Figure 10:
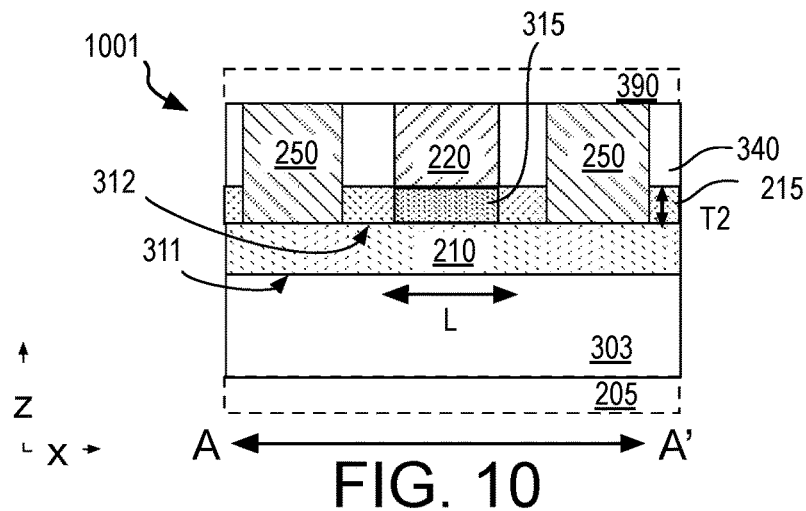
FIGS. 10, 11, 12, 13 and 14 are sectional views of transistor structures including a 2D passivation material, in accordance with some alternative embodiments.

FIG. 10 illustrates an exemplary transistor structure 1001 that includes a top-side gate electrode 220 along with top-side source/drain contact metallization 250. In this MOSFET architecture, gate dielectric 315 is again between gate electrode 220 and channel semiconductor material 210. 2D passivation material 215 is in contact with top surface 312 of channel semiconductor material 210, and occupies the lateral space between gate dielectric 315 and top-side source/drain contact metallization 250. 2D passivation material 215 is therefore in contact with an extrinsic portion of channel semiconductor material 210 on either side of the gate stack where leakage and/or damage to channel semiconductor material 210 would be particularly detrimental to transistor operation as these regions can experience high electric fields during transistor operation. With 2D passivation material 215 in contact with top surface 312, channel semiconductor 210 is again protected from subsequent processing (e.g., the deposition of dielectric material 340).

As noted in FIG. 10, transistor channel length L is dependent on physical dimensions of gate electrode 220 and also a lateral spacing between electrode 220 and source/drain contact metallization 250 where 2D passivation material 215 is present. In transistor structure 1001, 2D passivation thickness T2 may therefore again be significantly smaller than lateral channel length L, and may be also be smaller than channel thickness T.

Transistor structure 1001 may be fabricated according to a variety of techniques. However, methods 101 may be advantageously employed to self-passivate portions of the channel semiconductor material 210 not covered by the gate stack, or to generate the 2D passivation from some sacrificial precursor material that has been deposited over portions of the channel semiconductor material 210 adjacent to the gate stack. Source/drain metallization 250 may then be formed through 2D passivation material 215 according to any known techniques.

Figure 11:
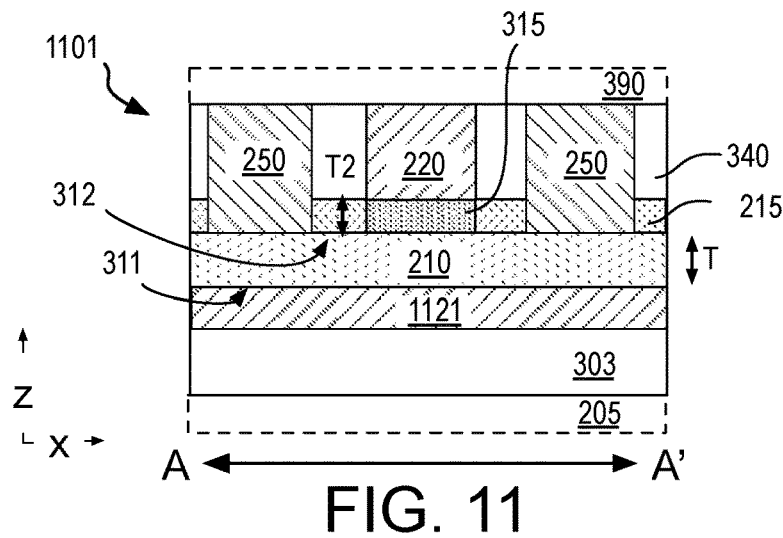

FIG. 11 illustrates a cross-sectional view of a four terminal transistor structure 1101, in accordance with some embodiments. In transistor structure 1101, a bias gate 1121 is added to the top-side three terminal transistor structure 1001 (FIG. 10). Bias gate 1121 is in contact with a bottom side of channel semiconductor material 210, opposite gate electrode 220. In this example, bias gate 1121 may set a body potential for channel semiconductor material 210 independent of any gate potential applied to gate electrode 220. Bias gate 1121 forms a metal-semiconductor junction with a bottom surface of channel semiconductor material 210. Bias gate 1121 may therefore have any metal composition having a suitable bandgap offset with channel semiconductor material 210. The four-terminal architecture of transistor structure 1101 may also be modified so as to add a gate dielectric (not depicted) between bias gate 1121 and channel semiconductor material 210. Bias gate 1121 may then be electrically tied to gate electrode 220 and operable as a portion of a double-gate.

Figure 12:
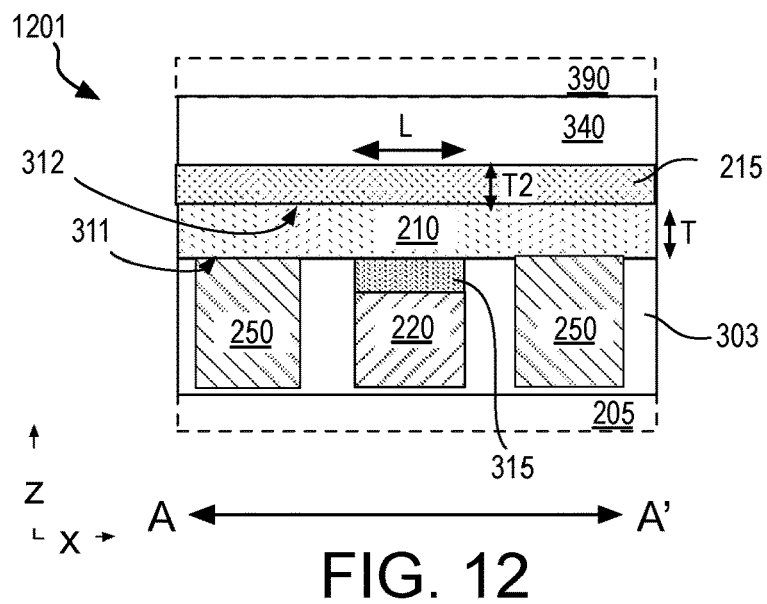

FIG. 12 illustrates a transistor structure 1201 that includes a bottom-side gate electrode 220 along with bottom-side source/drain contact metallization 250. In this MOSFET architecture, gate dielectric 315 is again between gate electrode 220 and channel semiconductor material 210. Similar to transistor structure 1101, transistor channel length L is dependent on physical dimensions of gate electrode 220, and also a lateral spacing between gate electrode 220 and source/drain contact metallization 250. In transistor structure 1201, 2D passivation material 215 is again in direct contact with a top surface 312 and extends over the entire channel length L, opposite the gate stack interfacing bottom channel surface 311. 2D passivation material 215 further extends laterally to be opposite source/drain contact metallization 250. In transistor structure 1201, 2D passivation material 215 may again have a thickness T2 significantly smaller than channel length L, and may be also be smaller than channel thickness T.

While transistor structure 1201 may be fabricated according to a variety of techniques, methods 101 may be advantageously employed to form 2D passivation material 215 by self-passivating channel semiconductor material 210, or by converting a previously deposited sacrificial precursor material (not depicted). Such passivation would be subsequent to the formation of source/drain metallization 250, gate dielectric 315, and gate electrode 220.

Figure 13:
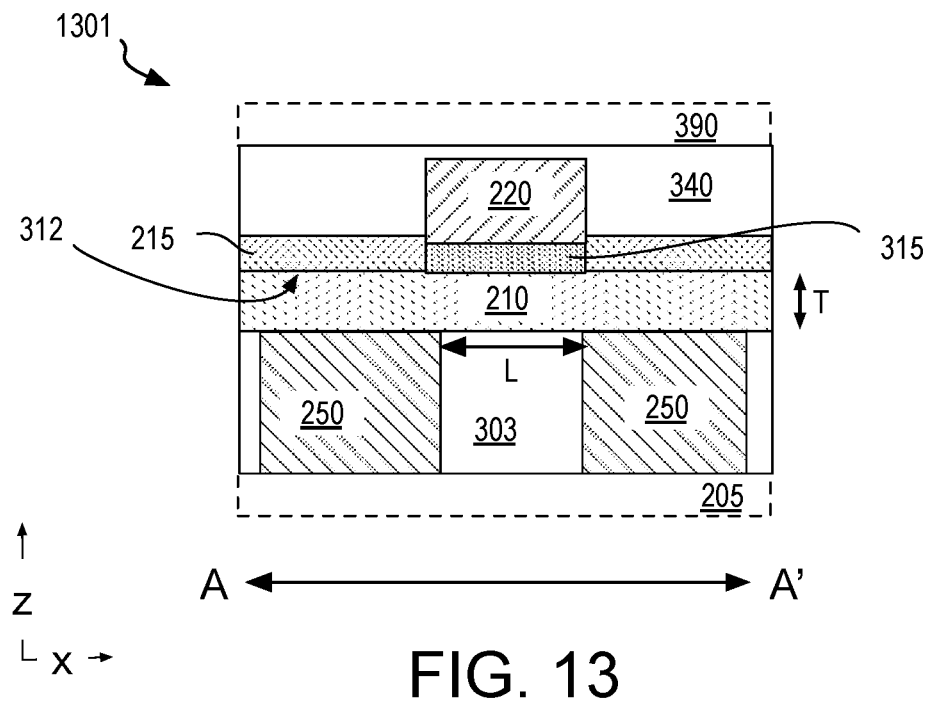

In FIG. 13, transistor structure 1301 comprises gate electrode 220 on a top-side of channel semiconductor material 210 while source/drain contact metallization 250 is on a bottom side of channel semiconductor material 210. Device terminals of transistor structure 1301 are inverted from those of transistor structure 201 (FIG. 3A-3C). As shown in FIG. 13, gate electrode 220 is therefore embedded within a dielectric material 340 while source/drain metallization 250 is embedded in dielectric material 303 on the side of substrate 205. In the "top-gate" architecture illustrated in FIG. 13, gate electrode 220 may extend over source/drain metallizations 250 by an arbitrary amount. 2D passivation material 215 is again in contact with top surface 312 that would otherwise be exposed in regions adjacent to a sidewall of the gate stack. 2D passivation material 215 may therefore stabilize channel semiconductor material 210 and avoid any interactions with a subsequently deposited dielectric material 340.

Figure 14:
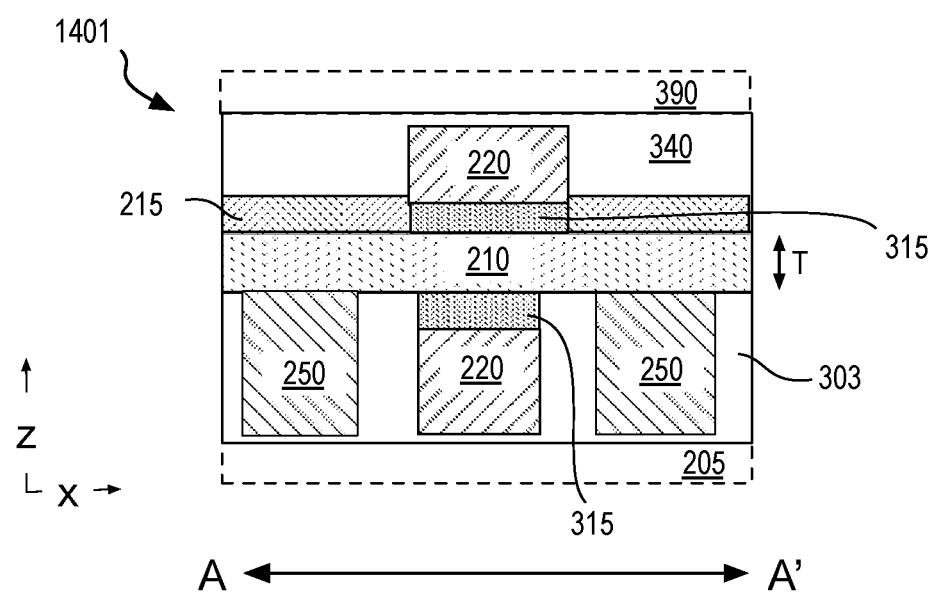

FIG. 14 depicts a double gate transistor structure 1401 that includes features of both transistor structure 1201 (FIG. 12) and transistor structure 1301 (FIG. 13). Transistor structure 1401 includes gate dielectric 315 under, and over, semiconductor body 210. Fabrication of transistor structure may therefore proceed with fabrication of source/drain metallization 250 and a first gate stack according to any suitable technique. Semiconductor body 210 may then be formed. Subsequently, a second gate dielectric 315 and gate electrode 220 may be fabricated in any manner. 2D passivation material 215 is formed over non-gated surfaces of semiconductor body 210 that would otherwise be exposed in regions adjacent to a sidewall of the gate stack. 2D passivation material 215 may therefore stabilize channel semiconductor material 210 and avoid any interactions with a subsequently deposited dielectric material 340.

Transistor structures having non-planar channel architectures are also possible. For such embodiments, a semiconductor channel material may be over a topographic feature with a transistor channel width and/or length then being decoupled from the area/footprint of the transistor structure. Some transistor structures with a non-planar channel architecture include a semiconductor body that is over a sidewall of one or more transistor terminals (e.g., gate electrode), or mandrel structures.

Figure 15:
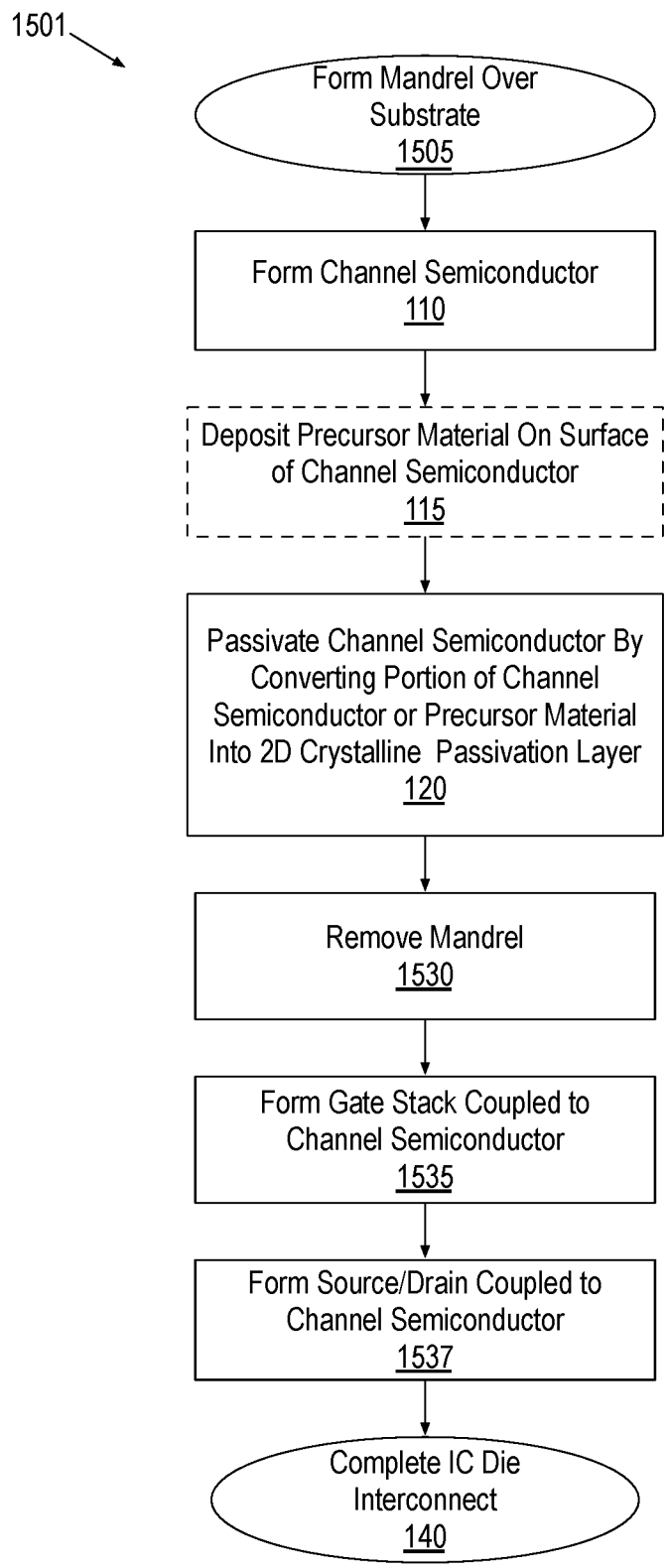
FIG. 15 is a flow diagram illustrating methods of fabricating transistor structures to include a 2D passivation material, in accordance with some embodiments.

FIG. 15 illustrates a flow diagram for methods 1501 for fabricating transistor structures that include a 2D passivation material, in accordance with some embodiments. Methods 1501 begin at block 1505 where a mandrel is formed over a substrate. The substrate may be any of the exemplary substrates described elsewhere herein. The mandrel may be sacrificial, or a permanent feature of a transistor structure. In some embodiments, the mandrel comprises a dielectric material that is patterned into a feature, such as, but not limited to, a pillar, a line, or any other polygon known to be suitable as a backbone double-patterning (e.g., pitch splitting) process. For other embodiments, for example where the mandrel is to further functional as a terminal of the transistor structure, the mandrel may comprise any of a gate electrode (and gate dielectric), a source terminal contact metallization, or a drain terminal contact metallization.

Figure 16A:
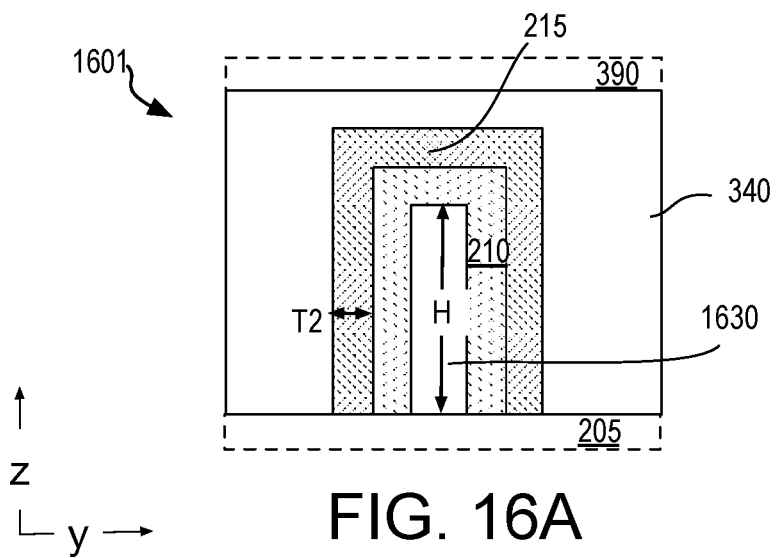
FIGS. 16A, 16B and 16C are cross sectional views of transistor structures including a 2D passivation material, in accordance with some alternative embodiments.

Methods 1501 then proceed to block 110 where channel semiconductor is formed, for example substantially as described above for methods 101. For methods 1501 however, the channel semiconductor material is formed over at least a sidewall of the mandrel, and in some embodiments the channel semiconductor material is blanket deposited over the top surface and sidewall of the mandrel structure, as well as over a field portion of the substrate between adjacent mandrel structures. The semiconductor channel material may be further patterned into separate semiconductor bodies. In some embodiments, the semiconductor channel material is etched anisotropically to remove the channel material from between mandrel structures while retaining the channel material on at least the sidewall of the mandrel structures as a semiconductor body. FIG. 16A further illustrates an exemplary transistor structure 1601 where semiconductor channel material 210 is retained on a sidewall of mandrel structure 1630.

With the semiconductor channel material present, methods 1501 (FIG. 15A) may continue at block 115, where a sacrificial precursor material may be optionally deposited upon an exposed surface of the channel semiconductor material if the channel semiconductor material is not to be self-passivated. Any of the materials described above in the context of methods 101 may be deposited at block 115, for example. Methods 1501 then continue at block 120 where 2D crystalline passivation material is formed on the channel semiconductor material, for example in accordance with any of the embodiments described above in the context of methods 101.

Methods 1501 (FIG. 15A) may continue at block 1530 where the mandrel structure is selectively removed in sacrificial mandrel embodiments. A mandrel structure may be removed from the front or back side of the semiconductor body and replaced with another structure, such as a gate electrode structure. In some embodiments the back side of channel semiconductor material may be accessed at block 1530, and additional 2D crystalline passivation material formed where the mandrel was removed (e.g., in another iteration of blocks 115 and 120).

In non-sacrificial mandrel embodiments of methods 1501, block 1530 may be skipped and a gate stack and source/drain terminals formed at blocks 1535 and 1537 according to any suitable technique(s). Methods 1501 may then be completed at block 140, substantially as described elsewhere herein. In further reference to FIG. 16A, mandrel structure 1630 may be permanent or a sacrificial feature ultimately removed from transistor structure 1601 for example through backside processing in which substrate 205 is removed either globally (e.g., wafer-level) or locally to transistor structure 1601 to expose mandrel structure 1630. Once exposed, a selective etch may be employed to remove mandrel structure 1630 and expose channel semiconductor material 210. Upon exposure, an additional passivation process may be performed to passivate a backside surface of channel semiconductor material 210.

Transistor structure 1601 includes a gate dielectric and gate electrode (not depicted) that is over the non-planar channel semiconductor material 210 where 2D passivation material 215 is absent. Mandrel structure 1630 has a height H, which may be vary, but is generally greater than 2D passivation material thickness T2, and may be 20-50 nm for example. For transistor structure 1601, 2D passivation material 215 is adjacent to only one sidewall of channel semiconductor material 210, while another sidewall of channel semiconductor material 210 is in contact with mandrel structure 1630. Formation of channel semiconductor 210 may be according to a variety of techniques including additive techniques (e.g. selective deposition) and subtractive techniques.

Figure 16B:
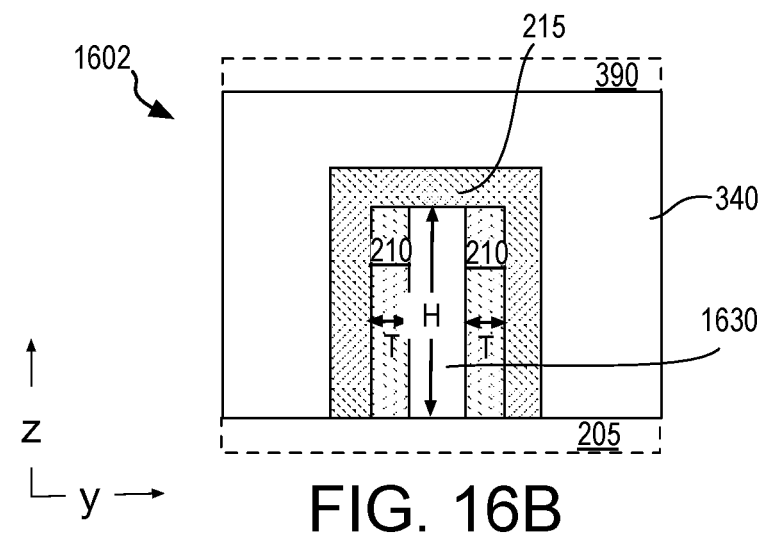

FIG. 16B illustrates another exemplary transistor structure 1602 that includes 2D passivation material 215 adjacent to a sidewall of channel semiconductor material 210. Transistor structure 1602 is similar to transistor structure 1601, however in transistor structure 1602 channel semiconductor material 210 has a top surface that is substantially planar with a top surface of mandrel structure 1630 (e.g., both have the same height H). Transistor structure 1602 may be formed for example when an unpatterned anisotropic etch of semiconductor material exposes a top surface of mandrel structure 1630 so that semiconductor channel material 210 is retained as only a self-aligned spacer along the sidewall of mandrel structure 1630. The resulting channel semiconductor material 210 may be a single (e.g., cylindrical) structure. Alternatively, transistor structure 1603 may be patterned in the second planar dimension (e.g., x-dimension) so that transistor structure 1602 comprises two separate transistor channels that may be controlled by a single gate stack, for example.

Figure 16C:
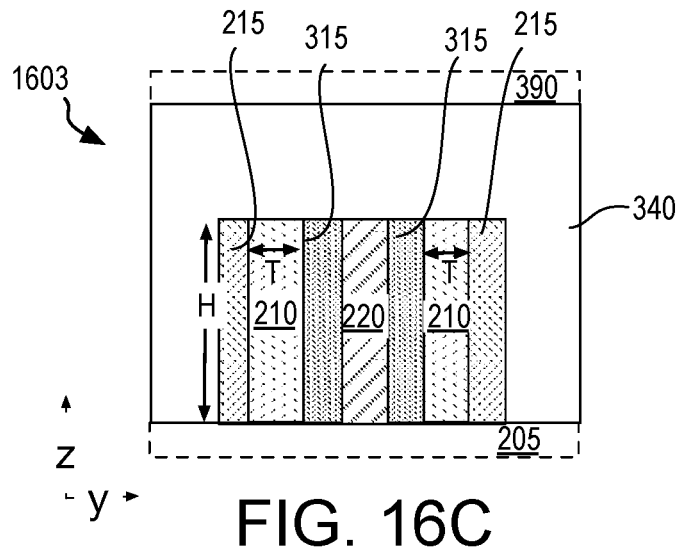

As noted above, a mandrel structure may be sacrificial. FIG. 16C further illustrates an alternative transistor structure 1603 where a mandrel structure was removed (e.g., from transistor structure 1602) prior to formation of gate dielectric 315 and gate electrode 220, which replace the mandrel structure. Gate electrode 220 and gate dielectric 315 may fill in between neighboring bodies of channel semiconductor material 210, as shown in FIG. 16C.

Figure 17:
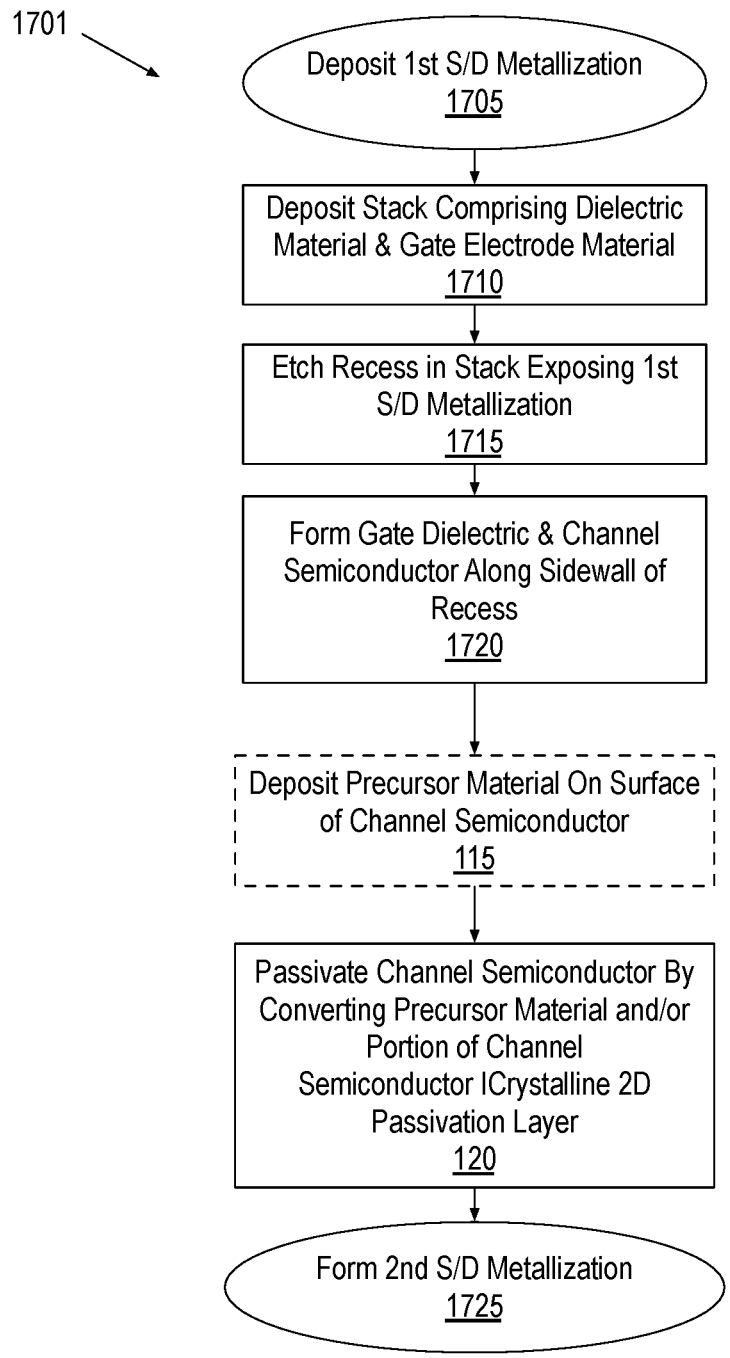
FIG. 17 is a flow diagram illustrating methods of fabricating transistor structures to include a 2D passivation material, in accordance with some embodiments.

While the transistor structures including a planar or non-planar 2D passivated channel architecture described above have a horizontal channel orientation (e.g., in one x-y plane), a 2D passivated transistor structure may also include a vertically-oriented channel where a first of the source or drain metallization is in a different x-y plane than a second of the source or drain metallization. In this class of vertically oriented non-planar architectures, a channel semiconductor material vertically separates source metallization from drain metallization and may be passivated in substantially the same manner described for planar channel devices. As shown in FIG. 17, for example, methods 1701 begin at block 1705 where a first source/drain metallization is formed over a substrate. At block 1710 a material stack including one or more layers of gate electrode material and one or more layers of any suitable dielectric material is deposited over the first source/drain metallization. A recess (e.g., a trench) is then formed through the material layer stack at block 1715, exposing the first source/drain metallization at a bottom of the recess. Methods 1701 continue at block 1720 where a gate dielectric is then formed over a sidewall of the gate electrode material layer(s) exposed within the recess, and channel semiconductor material is then formed over the gate dielectric along a sidewall of the recess. Exposed surfaces of the channel semiconductor may then be passivated at block 115 and block 120, for example substantially as described elsewhere herein. The structure is then capped with a second source/drain metallization at block 1725.

Figure 18A:
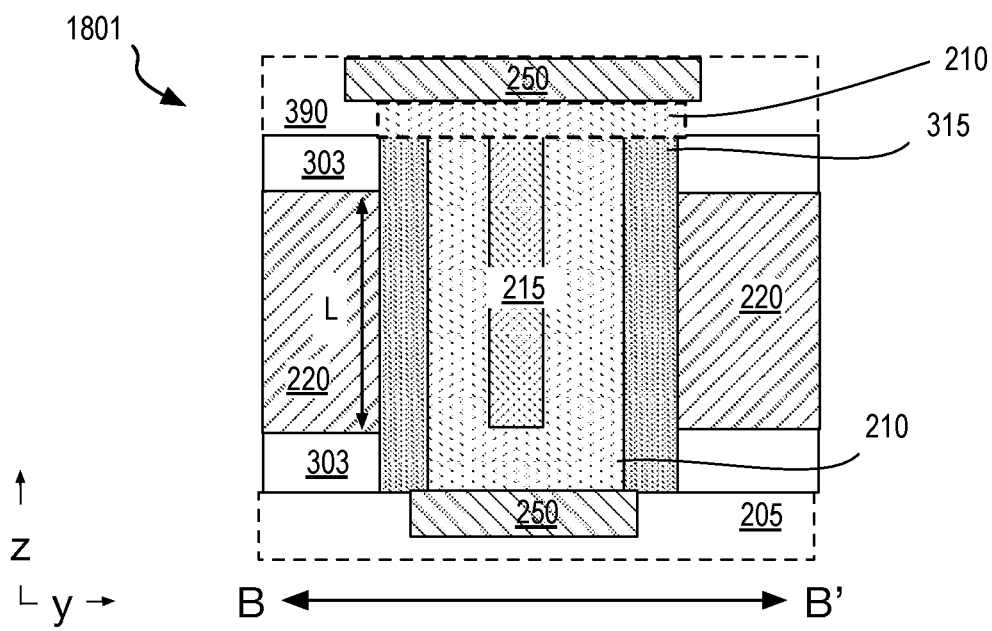
FIGS. 18A and 18B are cross sectional views of transistor structures including a 2D passivation material, in accordance with some alternative embodiments.

FIG. 18A illustrates one exemplary transistor structure 1801, which may be fabricated according to methods 1701 (FIG. 18A), for example. As shown in FIG. 18A, transistor structure 1801 includes top and bottom source and drain metallizations 250 in contact with channel semiconductor 210, which spans a vertical (e.g., z) distance between metallizations 250. As shown, vertical separation between source and drain metallizations 250 defines a channel length L of transistor structure 1801. 2D passivation material 215, which may be formed directly from channel semiconductor material 210 (e.g., through chalcogenation) may be very thin, as noted elsewhere herein, and may therefor passivate an interior surface of channel semiconductor 210 having minimal lateral dimensions.

Although transistor structure 1801 includes only one gate electrode 220, a stack may include any number of layers of gate electrode material. A vertical string of gate controlled semiconductor channels may be employed in a variety of devices, such as an electronic memory device. For example, various vertical NAND-type architectures may be include a channel semiconductor material passivated by a crystalline 2D material.

A vertical NAND architecture is one example where a stack of gate electrode material layers may each be operable as a control gate electrode in a string comprising many transistor channels. Such structures may be fabricated according to methods 1701, for example. Layers of gate electrode material may each be coupled to wordlines of a NAND memory array. Semiconductor channel material, may be coupled to a bitline, and further coupled to a select transistor, for example.

Figure 18B:
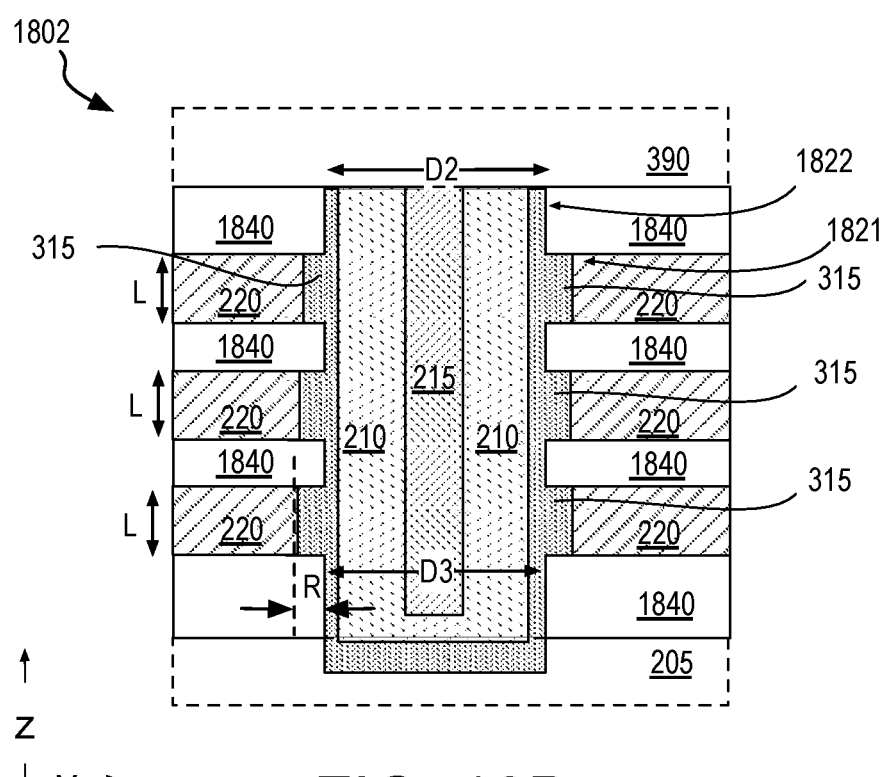

FIG. 18B is a cross sectional view of vertical thin film transistor structure 1802, in accordance with some embodiments. In FIG. 18B, transistor structure 1802 is again over a substrate 205, which is illustrated in dashed line to emphasize that substrate 205 may include number of underlying gate electrode material levels and/or FEOL circuitry levels. Similarly, any number of additional back-end of line (BEOL) material layers 390 may be over transistor structure 1802. Via diameter D2 may range from ten to a hundred nanometers, for example. In some exemplary embodiments, via diameter D2 is less than 70 nm (e.g., 40 nm, 50 nm, 60 nm, etc.). A lower via diameter D3 may be somewhat smaller than via diameter D2, depending on a sidewall slope, or profile, for example.

Dielectric material layers 1840 may each have any compositions and layer thicknesses. For example, dielectric material layers 1840 may be silicon dioxide, silicon nitride, silicon oxynitride, or any low-k material. In some exemplary embodiments, dielectric material layers 1840 have the same composition. Dielectric material layers 1840 may also have different compositions (e.g., where first alternating layers are silicon dioxide, and second alternating layers are a low-k material, etc.).

Channel semiconductor material 210 may have any of the compositions described above, for example, as formed according to methods 101. As further illustrated, transistor structure 1802 includes multiple layers of gate electrode material 220, each layer being separated by a layer of dielectric material 1840. Each layer of gate electrode material 220 has a sidewall 1821 that is recessed from dielectric material sidewall 1822 by a recess radial distance R. Radial distance R may vary from a few nanometers to tens of nanometers. In some examples, radial distance R is between 5 nm and 15 nm (e.g., 10 nm).

Gate dielectric material 315 at least partially occupies the recess of radial distance R. While gate dielectric material 315 may be any suitable material, such as any of those examples described above, for an Fe-NAND embodiment, gate dielectric material 315 is a ferroelectric material. Many high-k dielectric materials are ferroelectrics when crystal texture is of a particular phase. Dopants may be added to the gate dielectric material to promote such a ferroelectric crystal phase. Silicon is one example of ferroelectric phase promoting/stabilizing dopant for $HfO_X$ gate dielectric embodiments. In Fe (ferroelectric) FET (field effect transistor) embodiments, gate dielectric material 315 has a permanent dipole. As a result, the threshold voltage ($V_t$) of each FeFET can vary between multiple states (e.g., $V_{t,high}$ and $V_{t,low}$) as a function of the dipole state of the gate dielectric.

A bit value may be assigned to a particular one of the threshold voltage levels, and read out accordingly.

In some embodiments, gate dielectric material 315 is a cylindrical structure between the semiconductor material and a sidewall of gate electrode material layer 220. In the illustrated example, gate dielectric material 315 is in direct contact with gate electrode material sidewall 1821, and gate dielectric material 315 has a thickness substantially equal to radial distance R so that a semiconductor channel interface between semiconductor body 210 and gate electrode material 315 is substantially equal to via diameter D2. While gate dielectric material 315 is shown as also being present between semiconductor body 210 and dielectric material sidewall 1822, gate dielectric material 315 may also be localized to between gate electrode material 220 and semiconductor body 210 within channel portion(s) of transistor structure 1802. Channel thickness T is less than twice the via diameter D2 so that channel semiconductor material 210 is a cylindrical structure with 2D passivation material 215 being on an interior surface of channel semiconductor material 210. As shown, sidewall of a gate electrode material 220 is outside of via diameter D2.

Although individual transistor structures are described in detail, any number of such structures may be fabricated concurrently and included within integrated circuitry. The various transistor structures and techniques described above are applicable to active devices for any IC architecture. In some particularly advantageous embodiments however, the transistor structures and techniques described above are employed within a 3D IC having more than one device level. In some embodiments, any the transistor structures and techniques described above are iterated to generate two, three, or more levels of transistors, which may all be interconnected with inter-level metallization. In some other embodiments, any of the transistor structures and techniques described above are employed at least once to fabricate a back-end device level over a front-end device level. That front-end device level may comprise any suitable CMOS circuitry that may include transistors utilizing a Group IV semiconductor channel material, such as silicon, germanium, or SiGe alloys. Such front-end transistors may have single crystalline channel regions that employ a portion of a single crystalline substrate, for example.

Figure 19:
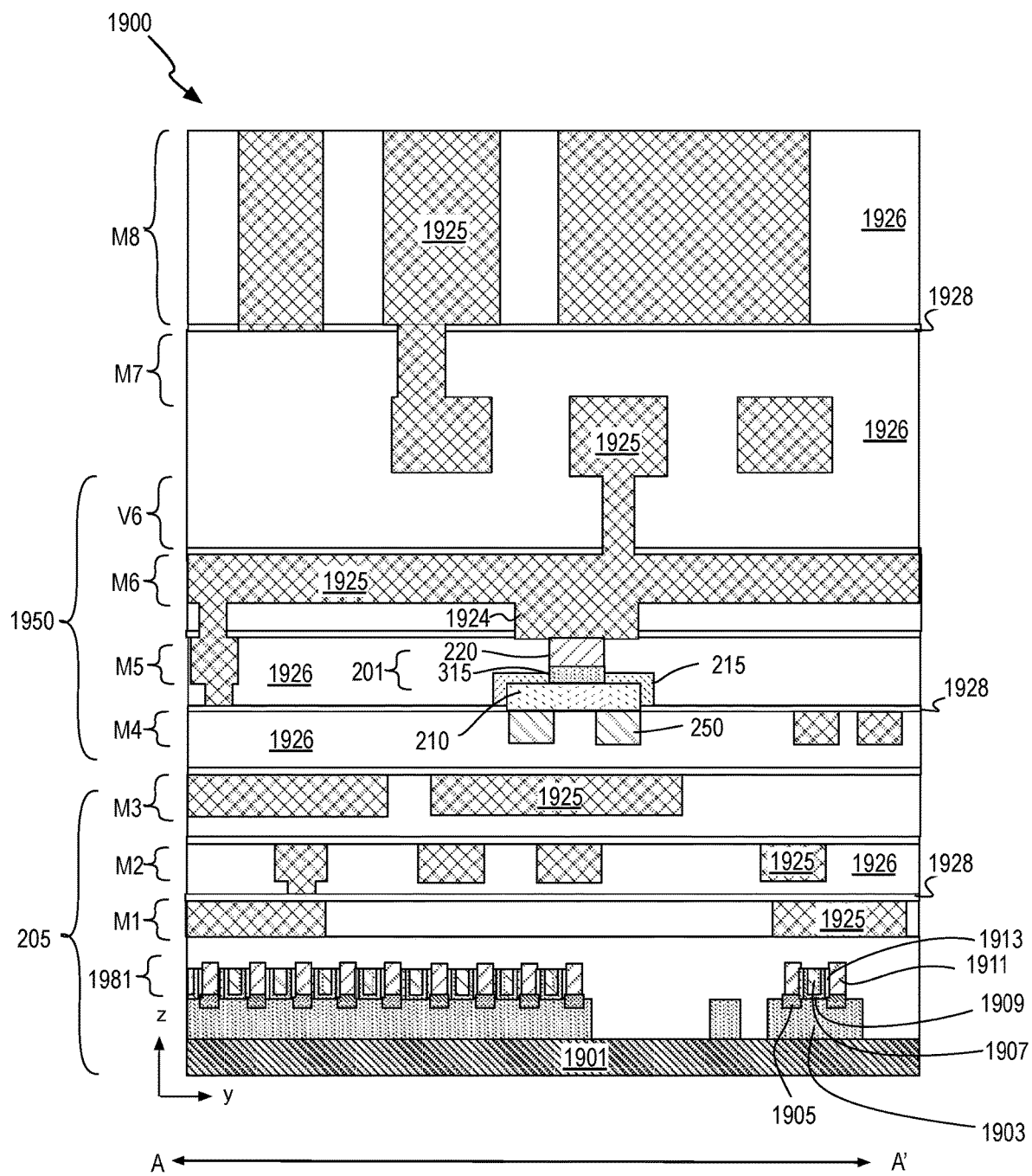
FIG. 19 is a cross-sectional view of a 3DIC structure including TFT circuitry over CMOS FET circuitry, in accordance with some embodiments.

FIG. 19 illustrates a cross-sectional side view of a 3D IC structure 1900, in accordance with some embodiments. Structure 1900 illustrates a portion of a monolithic IC that includes a substrate 205 that comprises FEOL device circuitry fabricated over and/or on a single crystalline substrate 1901. In this example, FEOL device circuitry includes a plurality of MOSFETs 1981 that employ a monocrystalline semiconductor material 1903 for at least a channel region of each transistor. In other embodiments, FEOL device circuitry includes other types of transistors (e.g., bipolar junction transistor, etc.), or other active devices employing one or more semiconductor materials (e.g., diodes, lasers, etc.). FETs 1981 include a gate terminal 1907 separated from a semiconductor material 1903 by a gate dielectric 1909. The channel region of semiconductor material 1903 separates semiconductor terminals 1905 (source semiconductor and drain semiconductor). Contact metallization 1911 is in contact with semiconductor terminals 1905 and is separated from gate terminal 1907 by an intervening dielectric spacer 1913. Any materials known to be suitable for FETs may be present in FEOL FETs 1981. FETs 1981 may be planar or non-planar devices. In some advantageous embodiments, FETS 1981 are finFETs. FETs 1981 may include one or more semiconductor materials. As one example, semiconductor material 1903 is a surface layer of a substantially monocrystalline substrate 1901. Substrate 1901 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry may further include one or more levels of interconnect metallization 1925 electrically insulated by dielectric materials 1926, 1928. In the exemplary embodiment illustrated, FEOL device circuitry includes metal-one (M1), metal-two (M2) and metal-three (M3) interconnect metallization levels. Interconnect metallization 1925 may be any metal(s) suitable for FEOL and/or BEOL IC interconnection. Interconnect metallization 1925, may be, for example, an alloy of predominantly Cu, an alloy of predominantly W, or an alloy of predominantly Al, etc. Dielectric material 1926 may be any dielectric material known to be suitable for electrical isolation of monolithic ICs. In some embodiments, dielectric material 1926 comprises silicon, and at least one of oxygen and nitrogen. Dielectric material 1926 may be SiO, SiN, or SiON, for example. Dielectric material 1926 may also be a low-K dielectric material (e.g., having a dielectric constant below that of $SiO_2$). Dielectric material 1928 has a different composition that dielectric material 1926, and may be of a composition that has a higher dielectric constant than that of dielectric material 1926. In some examples where dielectric material 1926 is predominantly silicon and oxygen (i.e., $SiO_x$), dielectric material 1928 is predominantly silicon and nitrogen (i.e., $SiN_x$).

BEOL device circuitry is located over the FEOL device circuitry, with dielectric material 1926 therebetween. BEOL device circuitry includes a plurality of devices 1950 that employ a channel semiconductor material 210 passivated with a 2D passivation material 215. In other embodiments, BEOL device circuitry includes other types of transistors (e.g., bipolar junction transistor, etc.), or other active devices (e.g., diodes, lasers, etc.) employing a 2D passivation material in contact with one or more surface of the active semiconductor material. For the illustrated embodiments, individual ones of devices 1950 include gate electrode 220 separated from a channel region of semiconductor body 210 by gate dielectric 315. In the exemplary embodiment illustrated, transistor structures 201 are "top-gate" devices with gate electrode 220 over channel semiconductor material 210. Although top-gate devices are illustrated, embodiments herein are also applicable to bottom-gate transistor architectures, side-gate transistor architectures, or other planar and non-planar transistor architectures, such as any of those described elsewhere herein.

BEOL circuitry may comprise any number of metallization levels over transistor structures 201, such as a metallization level (e.g., M6) immediately above the metallization level (e.g., M5) in which transistor structures 201 reside. As further shown, a via 1924 electrically connects interconnect metallization levels to gate electrode 220. Any number of interconnect metallization levels may be employed to couple BEOL circuitry to the underlying FEOL device circuitry. In the example shown in FIG. 19, metallization levels of BEOL circuitry (e.g., M8) may be routed down through any number of metallization levels (e.g., M8-M3) to be in electrical communication with one or more FEOL transistors 1981.

In further embodiments, there may be multiple levels of BEOL device circuitry located over the FEOL device circuitry, each with dielectric material 1926 therebetween.

Each level of BEOL device circuitry may include a plurality of devices 1950 that employ a 2D passivated channel semiconductor material.

In other embodiments, a 3DIC may include one or more levels of the BEOL device circuitry without any monocrystalline FEOL transistors. For such embodiments, the BEOL devices may be over any substrate (e.g., polymer, glass, etc.). Hence, transistors with 2D passivated channel semiconductor material may be employed in conjunction with monocrystalline channeled devices, or not.

Figure 20:
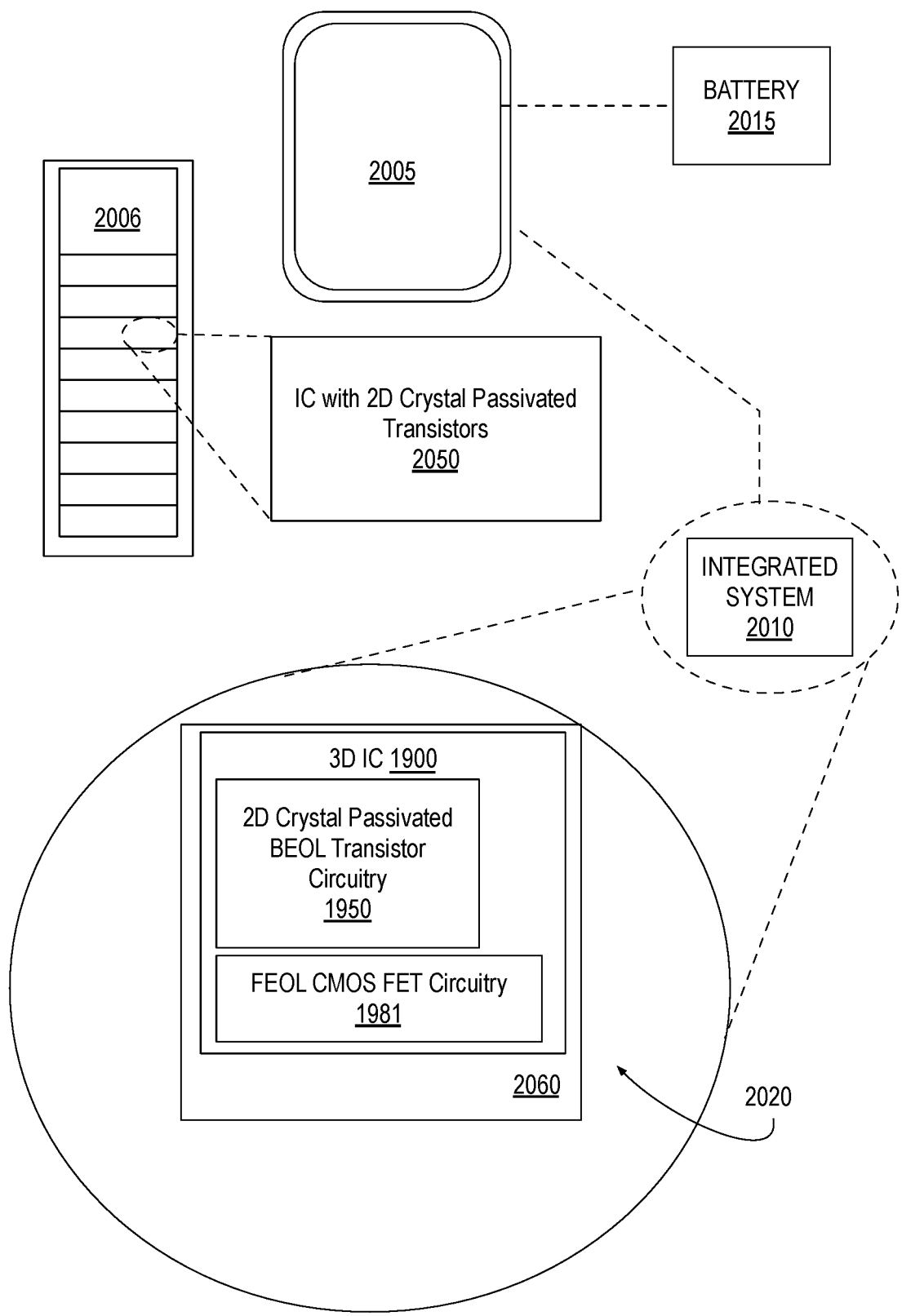
FIG. 20 illustrates a system employing an IC including TFT circuitry over CMOS FET circuitry, in accordance with some embodiments.

FIG. 20 illustrates a system in which a mobile computing platform 2005 and/or a data server machine 2006 employs an IC including at least one semiconductor device, which may be over another semiconductor device, in accordance with some embodiments. The server machine 2006 may be any commercial server, for example including any number of high-performance computing platforms disposed within a rack and networked together for electronic data processing, which in the exemplary embodiment includes a packaged monolithic IC 2050. The mobile computing platform 2005 may be any portable device configured for each of electronic data display, electronic data processing, wireless electronic data transmission, or the like. For example, the mobile computing platform 2005 may be any of a tablet, a smart phone, laptop computer, etc., and may include a display screen (e.g., a capacitive, inductive, resistive, or optical touchscreen), a chip-level or package-level integrated system 2010, and a battery 2015.

Whether disposed within the integrated system 2010 illustrated in the expanded view 2020, or as a stand-alone packaged chip within the server machine 2006, packaged monolithic 3D IC 1900 includes a memory chip (e.g., RAM), or a processor chip (e.g., a microprocessor, a multi-core microprocessor, graphics processor, or the like) including at least one semiconductor device passivated with a 2D crystalline material, for example as describe elsewhere herein. 3D IC 1900 may further include silicon CMOS front-end circuitry 1981. The 3D IC 1900 may be further coupled to a board, a substrate, or an interposer 2060.

3D IC 1900 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 2050 or within a single IC coupled to the package substrate of the monolithic IC 2050.

Figure 21:
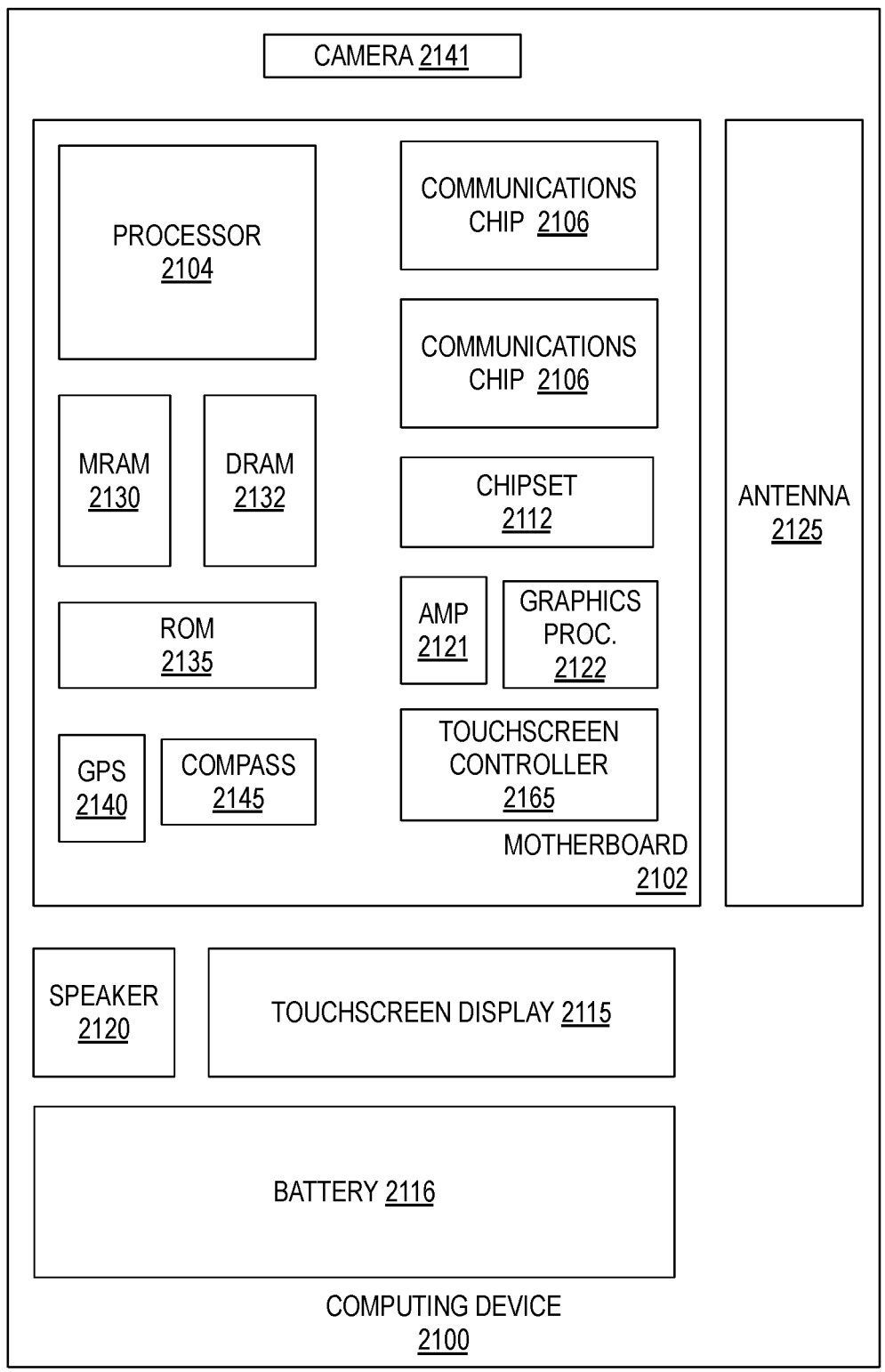
FIG. 21 is a functional block diagram illustrating an electronic computing device, in accordance with some embodiments.

FIG. 21 is a functional block diagram of an electronic computing device 2100, in accordance with some embodiments. Device 2100 further includes a motherboard 2102 hosting a number of components, such as, but not limited to, a processor 2104 (e.g., an applications processor). Processor 2104 may be physically and/or electrically coupled to motherboard 2102. In some examples, processor 2104 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 2106 may also be physically and/or electrically coupled to the motherboard 2102. In further implementations, communication chips 2106 may be part of processor 2104. Depending on its applications, computing device 2100 may include other components that may or may not be physically and electrically coupled to motherboard 2102. These other components include, but are not limited to, volatile memory (e.g., DRAM 2132), non-volatile memory (e.g., ROM 2135), flash memory (e.g., NAND or NOR), magnetic memory (MRAM 2130), a graphics processor 2122, a digital signal processor, a crypto processor, a chipset 2112, an antenna 2125, touchscreen display 2115, touchscreen controller 2165, battery 2116, audio codec, video codec, power amplifier 2121, global positioning system (GPS) device 2140, compass 2145, accelerometer, gyroscope, speaker 2120, camera 2141, and mass storage device (such as hard disk drive, solid-state drive (SSD), compact disk (CD), digital versatile disk (DVD), and so forth), or the like. In some exemplary embodiments, at least one of the functional blocks noted above comprise an IC including a transistor structure with a back-side contact metallization to deep source and/or drain semiconductor for example as described elsewhere herein.

Communication chips 2106 may enable wireless communications for the transfer of data to and from the computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2106 may implement any of a number of wireless standards or protocols, including but not limited to those described elsewhere herein. As discussed, computing device 2100 may include a plurality of communication chips 2106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a transistor structure comprises a channel semiconductor material, a source contact and a drain contact electrically coupled to the channel semiconductor material, a gate stack comprising a gate electrode material and a gate dielectric material. The gate dielectric material is in contact with a first region of the channel semiconductor, and the structure comprises a two-dimensional (2D) crystalline material in contact with a second region of the channel semiconductor material.

In second examples, for any of the first examples the 2D crystalline material is adjacent to the gate stack, and second region is between the first region and at least one of the source contact and drain contact.

In third examples, for any of the first through second examples the 2D crystalline material is on a side of the channel semiconductor opposite the gate stack with a thickness of the channel semiconductor material between the gate stack and the 2D crystalline material.

In fourth examples, for any of the first through third examples the 2D crystalline material has a thickness of less than 10 nm.

In fifth examples, for any of the fourth examples the 2D crystalline material has hexagonal crystallinity.

In sixth examples, for any of the first through fifth examples the 2D crystalline material comprises a metal and at least one of a chalcogen, nitrogen, or carbon.

In seventh examples, for any of the first through sixth examples the channel semiconductor material has n-type conductivity and the 2D crystalline material is a semiconductor having at least a conduction band offset from that of the channel semiconductor material.

In eighth examples, for any of the first through seventh examples the 2D crystalline material comprises one or more d-block or p-block metals and at least one of S, Se, or Te.

In ninth examples, for any of the eighth examples the 2D crystalline material is substantially a binary compound with composition $MC_x$, wherein M is a metal, C is Se or S, and x is between 0.2 and 4.

In tenth examples, for any of the ninth examples M is Zn and, C is S.

In eleventh examples, for any of the ninth examples M is a first metal and the channel semiconductor comprises a second metal other than the first metal, and wherein the channel semiconductor further comprises at least one of O, S, Se, or Te.

In twelfth examples, for any of the eleventh examples the channel semiconductor comprises O, In, Ga, and Zn, and wherein M is Zn, and C is Se or S.

In thirteenth examples, for any of the eleventh examples the channel semiconductor is substantially free of the first metal.

In fourteenth examples, an integrated circuit (IC) die comprises a plurality of complementary metal-oxide-semiconductor (CMOS) field effect transistor (FET) structures. Individual ones of the CMOS FET structures comprise a Group IV semiconductor material. The IC die comprises a plurality of back-end transistor structures over the CMOS FET structures, with one or more levels of interconnect metallization therebetween, wherein individual ones of the back-end transistor structures comprise the transistor structure of any of the first through thirteenth examples.

In fifteenth examples, an integrated circuit (IC) die comprises a plurality of complementary metal-oxide-semiconductor (CMOS) field effect transistor (FET) structures, wherein individual ones of the CMOS FET structures comprise a Group IV semiconductor material. The IC die comprises a plurality of back-end transistor structures over the CMOS FET structures, with one or more levels of interconnect metallization therebetween. Individual ones of the back-end transistor structures comprise a channel semiconductor material over at least one of a substrate dielectric material, a source contact, a drain contact, or a gate electrode, and a 2D crystalline material in contact with a portion of the channel semiconductor material.

In sixteenth examples, for any of the fifteenth examples the channel semiconductor material comprises $M1O_x$ and M1 is at least one of Cu, Zn, Cd, Ni, Co, Pd, Pt, Ti, Cr, V, Nb, W Mo, Al, Sn, Ga, In, P, As, or Sb. The 2D crystalline material comprises $M2S_x$, $M2Se_x$, or $M2Te_x$ and M2 is at least one of Cu, Zn, Cd, Ni, Co, Pd, Pt, Ti, Cr, V, Nb, W Mo, Al, Sn, Ga, In, P, As, or Sb.

In seventeenth examples for any of the fifteenth through sixteenth examples the channel semiconductor has a thickness of at least 10 nm, and the 2D crystalline material has a thickness less than 10 nm.

In eighteenth examples, for any of the fifteenth through seventeenth examples the 2D crystalline material has hexagonal crystallinity.

In nineteenth examples, for any of the sixteenth through eighteenth examples M1 and M2 are Zn.

In twentieth examples, a method of fabricating a transistor structure comprises forming a channel semiconductor material over a substrate. The method comprises forming a gate, source, and drain coupled to first regions of the channel semiconductor. The method comprises passivating a second region of the channel semiconductor exclusive of the first regions with a 2D crystalline material.

In twenty-first examples, for any of the twentieth examples passivating a second region of the channel semiconductor further comprises reacting the channel semiconductor with at least one of S, Se, or Te.

In twenty-second examples, for any of the twentieth through twenty-first examples passivating a second region of the channel semiconductor further comprises depositing a precursor material on the second region and reacting the precursor material with at least one of S, Se, or Te.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
    a channel semiconductor material comprising oxygen and one or more metals, wherein the channel semiconductor material has n-type conductivity;
    a source contact and a drain contact electrically coupled to the channel semiconductor material;
    a gate stack comprising a gate electrode material and a gate dielectric material, the gate dielectric material in contact with a first region of the channel semiconductor material;
    and
    a material layer comprising a metal and a chalcogen in contact with a second region of the channel semiconductor material, wherein the material layer is a semiconductor material having at least a conduction band offset from that of the channel semiconductor material.

2. The transistor structure of claim 1, wherein the material layer is adjacent to the gate stack, and the second region is between the first region and at least one of the source contact and drain contact.

3. The transistor structure of claim 1, wherein the material layer is on a side of the channel semiconductor material opposite the gate stack with a thickness of the channel semiconductor material between the gate stack and the material layer.

4. The transistor structure of claim 1, wherein the material layer has a thickness of less than 10 nm.

5. The transistor structure of claim 4, wherein the material layer comprises a monolayer having hexagonal crystallinity within a two-dimensional (2D) plane of the monolayer.

6. The transistor structure of claim 1, wherein the material layer comprises one or more d-block or p-block metals and at least one of S, Se, or Te.

7. The transistor structure of claim 6, wherein the material layer is predominantly a binary compound with composition $MC_x$, wherein M is the metal, C is Se or S, and x is between 0.2 and 4.

8. The transistor structure of claim 7, wherein M is Zn and, C is S.

9. The transistor structure of claim 1, wherein the material layer is predominantly a binary compound with composition $MC_x$, wherein M is a first metal and the channel semiconductor material comprises a second metal other than the first metal.

10. The transistor structure of claim 1, wherein the channel semiconductor material comprises O, In, Ga, and Zn, and wherein the material layer comprises Zn and Se or S.

11. The transistor structure of claim 9, wherein the first metal is absent from the channel semiconductor material.

12. An integrated circuit (IC) die, comprising:
a plurality of complementary metal-oxide-semiconductor (CMOS) field effect transistor (FET) structures, wherein individual ones of the CMOS FET structures comprise a Group IV semiconductor material; and
a plurality of back-end transistor structures over the CMOS FET structures, with one or more levels of interconnect metallization therebetween, wherein individual ones of the back-end transistor structures comprise:
a channel semiconductor material comprising oxygen and one or more metals;
a source contact and a drain contact electrically coupled to the channel semiconductor material;
a gate stack comprising a gate electrode material and a gate dielectric material, the gate dielectric material in contact with a first region of the channel semiconductor material;
and
a material layer comprising a metal and a chalcogen in contact with a second region of the channel semiconductor material.

13. An integrated circuit (IC) die, comprising:
a plurality of complementary metal-oxide-semiconductor (CMOS) field effect transistor (FET) structures, wherein individual ones of the CMOS FET structures comprise a Group IV semiconductor material; and
a plurality of back-end transistor structures over the CMOS FET structures, with one or more levels of interconnect metallization therebetween, wherein individual ones of the back-end transistor structures comprise:
a source contact, a drain contact, and a gate electrode;
a channel semiconductor material over at least one of a substrate dielectric material, the source contact, the drain contact, or the gate electrode, wherein the channel semiconductor material comprises oxygen and at least one of Cu, Zn, Cd, Ni, Co, Pd, Pt, Ti, Cr, V, Nb, W Mo, Al, Sn, Ga, In, P, As, or Sb; and
a material layer in contact with a portion of the channel semiconductor material, wherein the material layer comprises S, Se, or Te and at least one of Cu, Zn, Cd, Ni, Co, Pd, Pt, Ti, Cr, V, Nb, W Mo, Al, Sn, Ga, In, P, As, or Sb.

14. The IC die of claim 13, wherein
the channel semiconductor material comprises Zn, Ga, and In
the material layer comprises at least one of Zn, Ga, or In.

15. The IC die of claim 13, wherein the channel semiconductor material has a thickness of at least 10 nm, and the material layer has a thickness less than 10 nm.

16. The IC die of claim 13, wherein the material layer has hexagonal crystallinity.

17. The IC die of claim 16, wherein M1 is Zn.

* * * * *